United States Patent
Tanaka et al.

(10) Patent No.: US 8,212,345 B2
(45) Date of Patent: Jul. 3, 2012

(54) HOLDING JIG, SEMICONDUCTOR WAFER GRINDING METHOD, SEMICONDUCTOR WAFER PROTECTING STRUCTURE AND SEMICONDUCTOR WAFER GRINDING METHOD AND SEMICONDUCTOR CHIP FABRICATION METHOD USING THE STRUCTURE

(75) Inventors: Kiyofumi Tanaka, Saitama (JP); Satoshi Odashima, Saitama (JP); Noriyoshi Hosono, Saitama (JP); Hironobu Fujimoto, Itabashi-ku (JP); Takeshi Segawa, Itabashi-ku (JP)

(73) Assignees: Shin-Etsu Polymer Co., Ltd., Chuo-ku, Tokyo (JP); Lintec Corporation, Itabashi-ku, Tokyo (JP)

( * ) Notice: Subject to any disclaimer, the term of this patent is extended or adjusted under 35 U.S.C. 154(b) by 0 days.

(21) Appl. No.: 12/945,078

(22) Filed: Nov. 12, 2010

(65) Prior Publication Data

US 2011/0281509 A1  Nov. 17, 2011

Related U.S. Application Data

(62) Division of application No. 12/282,984, filed as application No. PCT/JP2007/054628 on Mar. 9, 2007, now Pat. No. 7,875,501.

(30) Foreign Application Priority Data

Mar. 15, 2006  (JP) ................................. 2006-070816
Mar. 15, 2006  (JP) ................................. 2006-071488
Mar. 15, 2006  (JP) ................................. 2006-071489

(51) Int. Cl.
 *H01L 23/02* (2006.01)
(52) U.S. Cl. ................ 257/678; 257/687; 257/E21.235; 257/E21.237; 257/E21.238; 257/E21.26; 257/E21.261; 257/E21.264; 257/E21.267; 257/E21.329

(58) Field of Classification Search .................. 257/347, 257/396, 678, 675, 687, E21.235, E21.237, 257/E21.238, E21.26, E21.261, E21.264, 257/E21.267, E21.329

See application file for complete search history.

(56) References Cited

U.S. PATENT DOCUMENTS 4,356,529 A  10/1982  Kopel
(Continued)

FOREIGN PATENT DOCUMENTS

JP  5-335411 A  12/1993
(Continued)

OTHER PUBLICATIONS

PCT/ISA/210 (International Search Report).
(Continued)

*Primary Examiner* — David Nhu
(74) *Attorney, Agent, or Firm* — Buchanan Ingersoll & Rooney PC

(57) ABSTRACT

A backgrinding machine 10 of a semiconductor wafer W includes: a table 13 set on the working plane of a mount 11; a multiple number of holding jigs 20 arranged via check tables 15 on table 13; a grinding machine 30 for performing a grinding process of the rear side of semiconductor wafer W held by holding jig 20; and a washing device 40 for ground semiconductor wafers W. Each holding jig 20 is constructed of a concave 22 depressed on the surface of a base plate 21, a multiple number of supporting projections 23 projectively arrayed on the bottom surface of concave 22, a deformable contact film 24, covering the concave 22, being supported by the multiple supporting projections 23, for detachably holding semiconductor wafer W in close contact with it; and an exhaust path 25 for conducting air from the concave 22 covered by contact film 24 to the outside.

15 Claims, 13 Drawing Sheets

U.S. PATENT DOCUMENTS

| | | |
|---|---|---|
| 6,910,898 B2 | 6/2005 | Suzuki et al. |
| 7,501,839 B2 | 3/2009 | Chan et al. |
| 7,511,375 B2 | 3/2009 | Kuroda et al. |
| 7,875,501 B2 * | 1/2011 | Tanaka et al. .................. 438/113 |

FOREIGN PATENT DOCUMENTS

| | | |
|---|---|---|
| JP | 2001-93864 A | 4/2001 |
| JP | 2003-261842 A | 9/2003 |
| JP | 2005-072496 A | 3/2005 |
| JP | 2005-093882 A | 4/2005 |
| JP | 2005-317651 A | 11/2005 |
| JP | 3882004 B2 | 2/2007 |

OTHER PUBLICATIONS

Notification of Transmittal of Translation of the International Preliminary Report on Patentability (Form PCT/IB/338), International Preliminary Report on Patentability (Form PCT/IB/373), Written Opinion of the International Search Authority (Form PCT/ISA/237) mailed in corresponding International Patent Application No. PCT/JP2007/054628, Sep. 25, 2008, The International Bureau of WIPO, Geneva, CH.

* cited by examiner

Semiconductor Wafer

Point of measurement

HOLDING JIG, SEMICONDUCTOR WAFER GRINDING METHOD, SEMICONDUCTOR WAFER PROTECTING STRUCTURE AND SEMICONDUCTOR WAFER GRINDING METHOD AND SEMICONDUCTOR CHIP FABRICATION METHOD USING THE STRUCTURE

CROSS REFERENCE TO RELATED APPLICATIONS

This application is a Divisional of U.S. application Ser. No. 12/282,984, filed Sep. 15, 2008, now U.S. Patent No. 7,875,501, which is the National Stage of International Application No. PCT/JP2007/054628, filed Mar. 9, 2007, the disclosures of both of which are incorporated herein by reference in their entirety, and claims priority to Japanese Application Nos. 2006-070816, 2006-071488 and 2006-071489, all filed on Mar. 15, 2006, the disclosures of all of which are incorporated herein by reference in their entirety.

TECHNICAL FIELD

The present invention relates to a holding jig and a semiconductor wafer grinding method for use in the backgrinding process and the like of semiconductor wafers. The invention also relates to a semiconductor wafer protecting structure and a semiconductor wafer grinding method using this structure, particularly relating to a semiconductor wafer protecting structure that is used in grinding a semiconductor wafer to a ultra-thin level and enables the semiconductor wafer to be dismounted from the fixing jig without breakage after grinding as well as to a semiconductor wafer grinding method using this structure. Further, the invention relates to a semiconductor chip-manufacturing method for reducing the wafer thickness by grinding the rear side of the wafer and dividing it into final individual chips, in particular relating to a fabrication method of semiconductor chips which is excellent in handling semiconductor chips after backgrinding.

BACKGROUND ART

A semiconductor wafer is formed to be about 775 μm thick when it is of a 300 mm diameter type in order to avoid its deformation during the previous process. However, this thickness as is, is not suitable for the recent semiconductor packages that are demanded to be thin, so that the wafer is thinned to 100 μm or lower during the process of grinding the rear side called a backgrinding process, then is separated into individual chips by a dicing process.

In the backgrinding process of a semiconductor wafer W, in order to protect the pattern-forming surface of semiconductor wafer W on which circuits have been formed, a soft protection sheet (also called a BG sheet) 1 is adhered to the surface and cut so that its size is marginally greater than the size of semiconductor wafer W (see FIG. 25). Then, semiconductor wafer W is set on the table of a backgrinding machine, and the table is turned so that semiconductor wafer W is placed and positioned in the work area of the grinding machine.

Protection sheet 1 is formed of a lamination of a film base of 50 to 200 μm thick, made of ethylene-vinyl acetate copolymer or soft polyvinyl chloride, and a ultraviolet (UV) curable type or non-UV-curing type adhesive layer of 10 to 60 μm thick, of acrylic, urethane, butadiene, silicone or other material, and is peeled off after the backgrinding process and discarded without being reused after once it is used.

After semiconductor wafer W has been placed and positioned in the work area of the grinding machine, the rear side of semiconductor wafer W is ground by a rotary grindstone 33 (see FIG. 26). Then the rear side of semiconductor wafer W is etched about 1 μm by chemical 41 to remove the damaged layer from grinding (see FIG. 27) to thereby achieve the thinning of semiconductor wafer W (see patent document 1).

The semiconductor wafer W, after it has been thus thinned, is fixed to a hollow carrier jig 44 by applying its etched rear side to an adhesive tape, specifically, UV tape 42 that will be used at the dicing process while protection sheet 1 is peeled off from the pattern forming surface of semiconductor wafer W by use of a peeling tape 43 (see FIG. 28), then the semiconductor wafer W supported by carrier jig 44 (see FIG. 29) is divided into individual chips by a grindstone called a blade.

Patent Document 1: Japanese Patent Application Laid-open 2005-93882.

DISCLOSURE OF INVENTION

Problems to be Solved by the Invention

Since semiconductor wafer W is self-supporting up to about 100 μm in thickness, it can be supported and conveyed if it is suctioned from above by a suctioning pad having suctioning holes.

However, when semiconductor wafer W is ground to about 50 μm or lower in thickness, the semiconductor wafer W exhibits a poor self-supporting performance, being lowered in strength. Accordingly, breakage of semiconductor wafer W occurs frequently because the wafer is flexed due to gravity at the positions away from the suctioning holes of the suctioning pad.

As the countermeasure to prevent such breakage of semiconductor wafer W, protection sheet 1 may be adhered to semiconductor wafer W. However, even when protection sheet 1 is adhered to semiconductor wafer W, it is impossible for a normal soft protection sheet 1 to keep high enough strength, hence deformation due to gravity will still arise. It is also possible to use a rigid protection sheet 1, this case, however, entails a high risk of semiconductor wafer W being broken when protection sheet 1 is peeled off from semiconductor wafer W because tensile force acts on the wafer in the thickness direction (in the direction perpendicular to the surface) in which the strength of semiconductor wafer W is weak.

In the conventional operation after the backgrinding process of semiconductor wafer W, since there is the fear that the ultra-thinned semiconductor wafer W deforms due to gravity and is broken as described above, in order to avoid the risk it is necessary to use a conveyor having a special handling structure which can suction and hold the whole surface of semiconductor wafer W. Further, since the protection sheet that was once used in the backgrinding process of semiconductor wafer W is hard to be reused and has to be discarded, there is the serious problem that it is impossible to avoid generation of a large amount of waste.

On the other hand, grinding the rear side of semiconductor wafer W after formation of circuit patterns has been practiced conventionally. In this process, backgrinding is performed while an adhesive sheet is adhered to the circuit surface so as to protect the circuit surface and fix the semiconductor wafer W. For this purpose, an adhesive sheet that is formed of a soft base and an adhesive applied thereon has been conventionally used. However, in using such an adhesive sheet of a soft base, the tensile force that was acted when it was adhered will end up remaining as a residual stress. When the semiconductor wafer W was large in diameter or when the wafer was ground to a ultra-thin level, the residual stress of the adhesive sheet exceeded the strength of semiconductor wafer W, causing deformation of semiconductor wafer W by the force for canceling this residual stress. Further, since semiconductor wafer W is fragile after grinding, use of a soft base caused breakage of semiconductor wafer W during transportation.

To deal with this, use of a rigid base as the base of protection adhesive sheet for thin semiconductor wafer W and for large-diametric semiconductor wafer W has been studied. However, when an adhesive sheet using a rigid base is peeled off, a bending stress that arises during peeling due to the rigidity of the base transfers to semiconductor wafer W, hence there is a fear that semiconductor wafer W, which has already become fragile, is damaged. In order to solve this problem, use of energy ray-curable adhesives as the adhesive was studied in order to facilitate separation of the adhesive sheet made of a rigid base. However, since simple use of an energy ray-curable adhesive as the adhesive for adhering semiconductor wafer W is not enough to completely eliminate the bending stress that arises at the time of peeling, there still remains a fear of semiconductor wafer W being broken.

In order to solve this problem, provision of a stress relaxation film between a rigid base and adhesive layer was studied (see Japanese Patent Application Laid-open 2003-261842). However, there are some kinds of stress that cannot be eliminated completely by use of a stress relaxation film occurring at the time of peeling the adhesive sheet, hence there still remains a fear of semiconductor wafer W being broken. Further, there is the fact that the conventional rigid base cannot support a large-diametric semiconductor wafer W.

On the other hand, a fabrication process of semiconductor chips is known as a method for achieving reduction in thickness of chips, whereby grooves of a predetermined depth are formed first on the front side of semiconductor wafer W (half-cut dicing), then semiconductor wafer W is ground from the rear side. This process is called a "dicing before grinding method" (Japanese Patent Application Laid-open Hei 5-335411).

In the process of the dicing before grinding method, since semiconductor wafer W will be divided into chips at the same time when the wafer becomes extremely thin, the area becomes smaller compared to the thickness. Accordingly, breakage becomes unlikely to occur during conveyance and delivery of semiconductor wafers W. Further, cracking (chipping) on the sections of the chips that is liable to occur when full-cut dicing is performed is unlikely to occur in the dicing before grinding method.

In connection with the above, the chips that were divided by the dicing before grinding process are connected by the adhesive sheet for surface protection. However, since the adhesive sheet is not rigid, there is the problem that the subsequent step cannot be done unless a special conveyor device that can support the whole surface is used. On the other hand, if the adhesive sheet is given with rigidity such as to be able to support the chips, there occurs the problem that it is difficult to peel off the adhesive sheet from the chips.

The present invention has been devised in view of the above, it is therefore an object of the present invention to provide a holding device and a semiconductor wafer grinding method that can eliminate the problems entailed with use of protection sheets. It is another object to provide a semiconductor wafer protecting structure with which a thin or large-diametric wafer can be subjected to backgrinding while it is being fully supported, the wafer can be ground to be ultra thin without causing deformation and the wafer can be detached from the fixing jig without any damage as well as providing a semiconductor wafer grinding method using this protecting structure. In addition, it is an object to provide a semiconductor chip fabrication method which enables use of an ordinary conveyor device and the like in a dicing before grinding process, thereby it is also an object to realize provision of highly reliable ultra-thin chips at a relatively low cost.

Means for Solving the Problems

In the present invention, in order to solve the above problems, a holding jig for holding a semiconductor wafer, includes: a depressed portion formed on a rigid base plate; a plurality of supporting projections arrayed in the depressed portion; a deformable contact film layer, covering the depressed portion, being supported by the plurality of supporting projections, for detachably holding a semiconductor wafer in close contact therewith; and, an exhaust path for conducting air from the depressed portion covered by the contact film layer to the outside.

Here, inclusion of a negative pressure source for producing a negative pressure in the depressed portion to deform the contact film layer is preferable.

Also, the contact film layer may contain an antistatic agent.

The array pitch between the plural supporting projections may be specified to be 0.2 to 2.0 mm.

The width of the supporting projection may be specified to be 0.05 to 1.0 mm.

The height of the supporting projection may be specified to be 0.05 to 0.5 mm.

Further, the thickness of the contact film layer may be specified to be 20 to 200 μm.

The tensile strength at break of the contact film layer may be specified to be equal to or greater than 5 MPa.

The elongation at break of the contact film layer may be specified to be equal to or greater than 500%.

The bending elasticity at normal temperature of the contact film layer may be specified to be 10 to 100 MPa.

Also, the holding jig according to any one of claims 1 through 10 can be used for a semiconductor wafer grinding process.

A method may include the steps of: holding a semiconductor wafer adhesively with the front side formed circuits of the semiconductor wafer put in contact with the contact film layer of the holding jig; and grinding the rear side of the semiconductor wafer to a predetermined thickness.

Here, the method may include the step of: after grinding the rear side of the semiconductor wafer to a predetermined thickness, performing an etching process on the rear side of the semiconductor wafer while the semiconductor wafer is being adhesively held by the holding jig.

Further, a semiconductor wafer protecting structure of the present invention includes a semiconductor wafer, an adhesive sheet laminated on the circuit surface of the semiconductor wafer and a fixing jig, laid over each other in the order mentioned, and is characterized in that the fixing jig comprises: a jig base having a plurality of projections on a first side thereof and a side wall having the approximately the same height as the projections, formed along the periphery on the first side; and a contact layer, laminated over the surface of the jig base having the projections, and bonded to the top surface of the side wall, a sectioned space is formed on the surface of the jig base on which projections are formed, by the contact layer, the projections and the side wall, at least one passage hole that is penetrated to connect the sectioned space to the outside is formed in the jig base, and the contact layer is laid over the surface of the adhesive sheet laminated on the circuit surface of the semiconductor wafer.

It is preferred that the adhesive sheet is comprised of a base one side of which has a surface energy of 20 to 60 mN/m and a surface roughness (arithmetic mean roughness Ra) of 1.0 μm or lower and an adhesive layer provided on the opposite surface, and the adhesive layer abuts the circuit surface.

It is also preferred that the adhesive sheet is comprised of a base, a middle layer formed on the base and an adhesive layer formed on the middle layer, and the elasticity of the adhesive layer at 23 deg. C. ranges from $5\times10^4$ to $1.0\times10^7$ Pa, and the elasticity of the middle layer at 23 deg. C. is equal to or lower than the elasticity of the adhesive layer at 23 deg. C.

Further, it is also preferred that the adhesive sheet is formed of a base of which the maximum value of tan δ of dynamic viscoelasticity in the temperature range of −5 to 80 deg. C. is 0.5 or greater, and an adhesive layer.

Further, a semiconductor wafer grinding method of the present invention includes the step of: after grinding the rear side of the wafer to a predetermined wafer thickness under the condition in which the semiconductor wafer protecting structure is mounted with the jig base side resting on a processing table of a wafer grinding machine, deforming the contact layer jaggedly by suctioning air from the sectioned space through the passage hole; detaching the semiconductor wafer attached with the adhesive sheet from the contact layer; and removing the adhesive sheet from the semiconductor wafer.

A semiconductor chip fabrication method includes: (I) the step of forming grooves on the circuit surface side of a wafer having a plurality of circuits formed thereon, along the circuits with a cut depth shallower than the thickness of the wafer; (II) the step of laying a fixing jig over the circuit surface; (III) the step of dividing the wafer into a group of chips by grinding the rear side of the wafer to reach the grooves, and is characterized in that the fixing jig comprises: a jig base having a plurality of projections on a first side thereof and a side wall having the approximately the same height as the projections, formed along the periphery on the first side; and a contact layer laminated over the surface of the jig base having the projections, and bonded to the top surface of the side wall, a sectioned spaced is formed on the surface of the jig base on which projections are formed, by the contact layer, the projections and the side wall, at least one passage hole that is penetrated to connect the sectioned space to the outside is formed in the jig base, and the adhesive layer is laid over the circuit surface.

It is preferred that the above fabrication method further includes the steps of: adhering a transfer tape fixed in a frame to the rear side of the group of chips after the wafer was divided into a group of chips at the step (III); and detaching the group of chips from the contact layer by deforming the contact layer jaggedly by suctioning air from the sectioned space through the passage hole and transferring the group of chips to the transfer tape.

It is preferred that the contact layer is laid over the wafer circuit surface by a contact layer.

The semiconductor wafer in the scope of Claims is not limited by its type such as 200 mm diameter type, 300 mm diameter type, etc. This semiconductor wafer is appropriately formed with an orientation flat or notch for distinguishing the crystal orientation and facilitating alignment. The holding jig and its base plate may be formed in circular, elliptic, rectangular, polygonal and other forms, when viewed from top. The numbers of depressed portions, contact layers and exhaust paths are not limited.

The depressed portion may be formed in circular, elliptic, rectangular, polygonal and any other forms, when viewed from top. Also, plural projections may be arranged regularly or irregularly in the depressed portion. The plurality of projections may be formed integrally with, or formed separately from, the depressed portion. The projection may be formed in cylindrical, truncated cone, prism-formed, truncated pyramid and other shapes. Further, the contact layer may be as large as or greater than the semiconductor wafer as long as it is of a size that supports the semiconductor wafer.

Effect of the Invention

According to the present invention, since it is possible to perform a semiconductor wafer grinding process without using a protection sheet for semiconductor wafers, it is possible to efficiently eliminate the problems entailed with the use of protection sheets, such as the increased generation of waste due to disposal of protection sheets, and conduction failure and contamination of semiconductor wafers due to residual glue.

Also, since a contact film layer that is excellent in adhesiveness a mere film or sheet is used, it is possible to prevent the semiconductor wafer from being displaced or broken, by close adhesion of the contact layer even if the semiconductor wafer is thinned as thin as 100 μm or below.

Further, addition of an antistatic agent to the contact layer makes it possible to suppress electrostatic breakage of semiconductor wafers.

Moreover, when the array pitch between the plural supporting projections is specified to be 0.2 to 2.0 mm, there is no risk of the contact film layer rupturing or cleaving as the holding jig is repeatedly used, and it is also possible to reduce the variation in thickness after grinding the semiconductor wafer.

When the width (thickness) of the supporting projection is specified to be 0.05 to 1.0 mm, there is no risk that the supporting projections hole or damage the contact film layer by upon detachment of the semiconductor wafer, and lower the strength of themselves. Further, it is possible to avoid difficulties in detaching the semiconductor wafer due to excessive increase of the adhesion of the supporting projection portion to the semiconductor wafer.

When the height of the supporting projection is specified to be 0.05 to 0.5 mm, the semiconductor wafer can be easily detached from the contact film layer, and it is also possible to exclude the risk of the semiconductor wafer being ground more than needed at the points of the supporting projections during backgrinding and the risk of the contact layer being extended more than needed, hindering adhesion to the semiconductor wafer.

Specifying the thickness of the contact film layer to be 20 to 200 μm, makes it possible to improve the durability of the contact film layer, enables the contact film layer to follow the bumpiness on the pattern forming surface of the semiconductor wafer and makes it possible to control semiconductor wafer contamination due to penetration of the grinding liquid and the like. Further, this enables rapid detachment of the semiconductor wafer from the contact film layer.

Specifying the tensile strength at break of the contact film layer to be equal to or greater than 5 MPa, makes it possible to exclude the risk of the contact film layer being broken when it is deformed.

Specifying the elongation at break of the contact film layer to be equal to or greater than 500% enables the contact film layer to positively follow the plural supporting projections when it is deformed, and there is no risk of rupture.

Further, when the bending elasticity at normal temperature of the contact film layer is specified to be 10 to 100 MPa, there is no risk that the area of the contact film layer other than those supported by the supporting projections slackens, causing hindrance to adhesion of the semiconductor wafer to the contact film layer, and it is also possible to exclude the risk that it becomes difficult for the semiconductor wafer to be detached from the contact film layer.

When a semiconductor wafer is ground using the semiconductor wafer protecting structure according to the present invention, it is possible to fully support the wafer when backgrinding of a thin wafer or a large-diametric wafer is performed and it is possible to grind the wafer to an extremely thin level without flexing the wafer and also detach the wafer from the fixing jig without breaking the wafer.

According to the semiconductor chip fabrication method of the present invention, it is possible to easily detach the divided chips, and use of the fixing jig having rigidity enables delivery of the chips after dicing before grinding method to the subsequent step without using any special transfer device.

Figure 1:
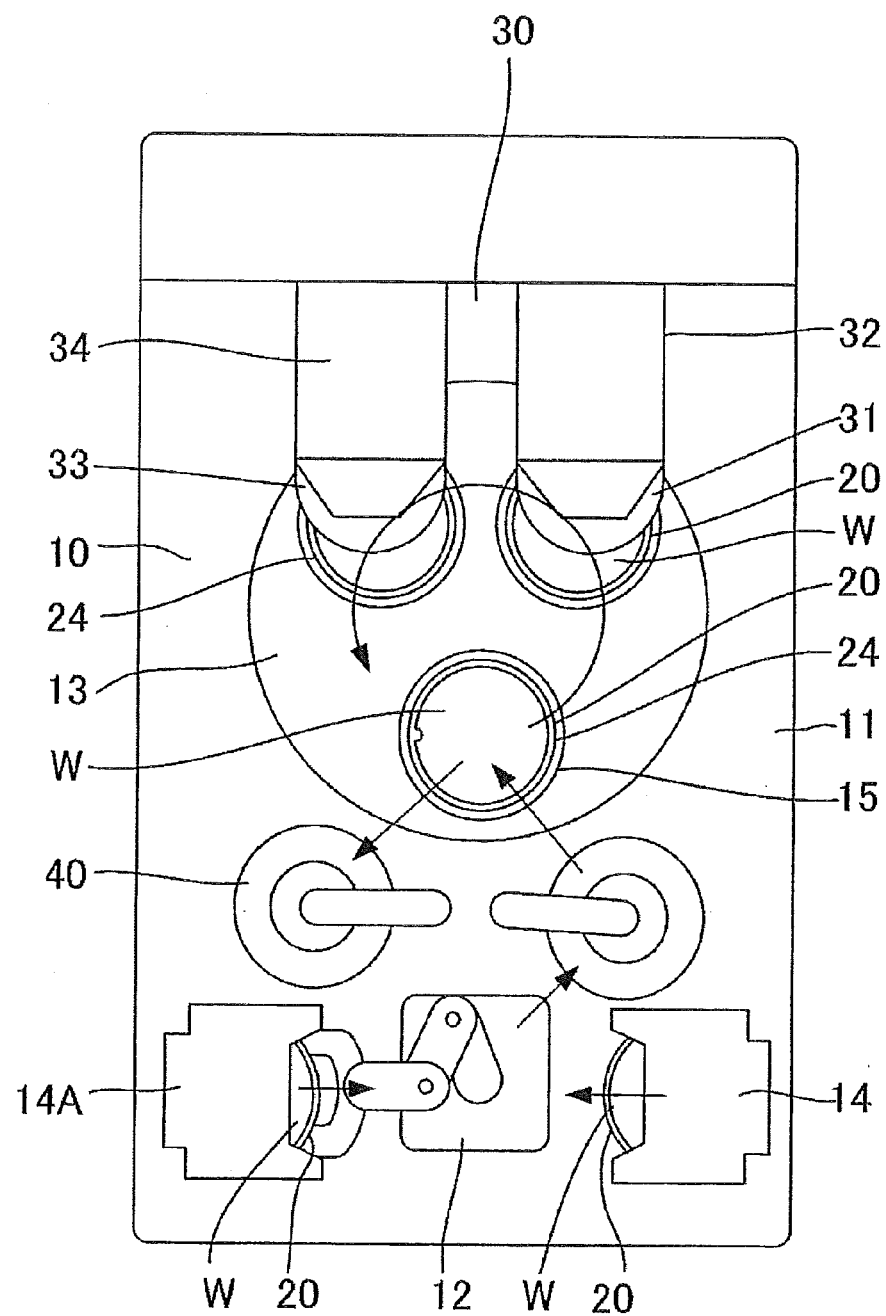
FIG. 1 is an illustrative plan view schematically showing a backgrinding machine in an embodiment of a holding jig and a semiconductor wafer grinding method according to the present invention.

DESCRIPTION OF REFERENCE NUMERALS 1 protection tape
10 backgrinding machine
13 table
15 chuck table
20 holding jig
21 base plate
22 concave (depressed portion)
23 supporting projection
24 contact film (contact film layer)
25 exhaust path
26 vacuum pump (negative pressure source)
27 antistatic layer
30 grinding device
32 rough grinder
34 finish grinder
50 adhesive sheet
50A adhesive sheet
60 fixing jig
61 jig base
62 contact layer
63 side wall
64 projection
65 sectioned space
66 passage hole
70 vacuum device W semiconductor wafer
Wc semiconductor chip
Wg semiconductor wafer ground surface
Ws semiconductor wafer groove

BEST MODE FOR CARRYING OUT THE
INVENTION

Figure 2:
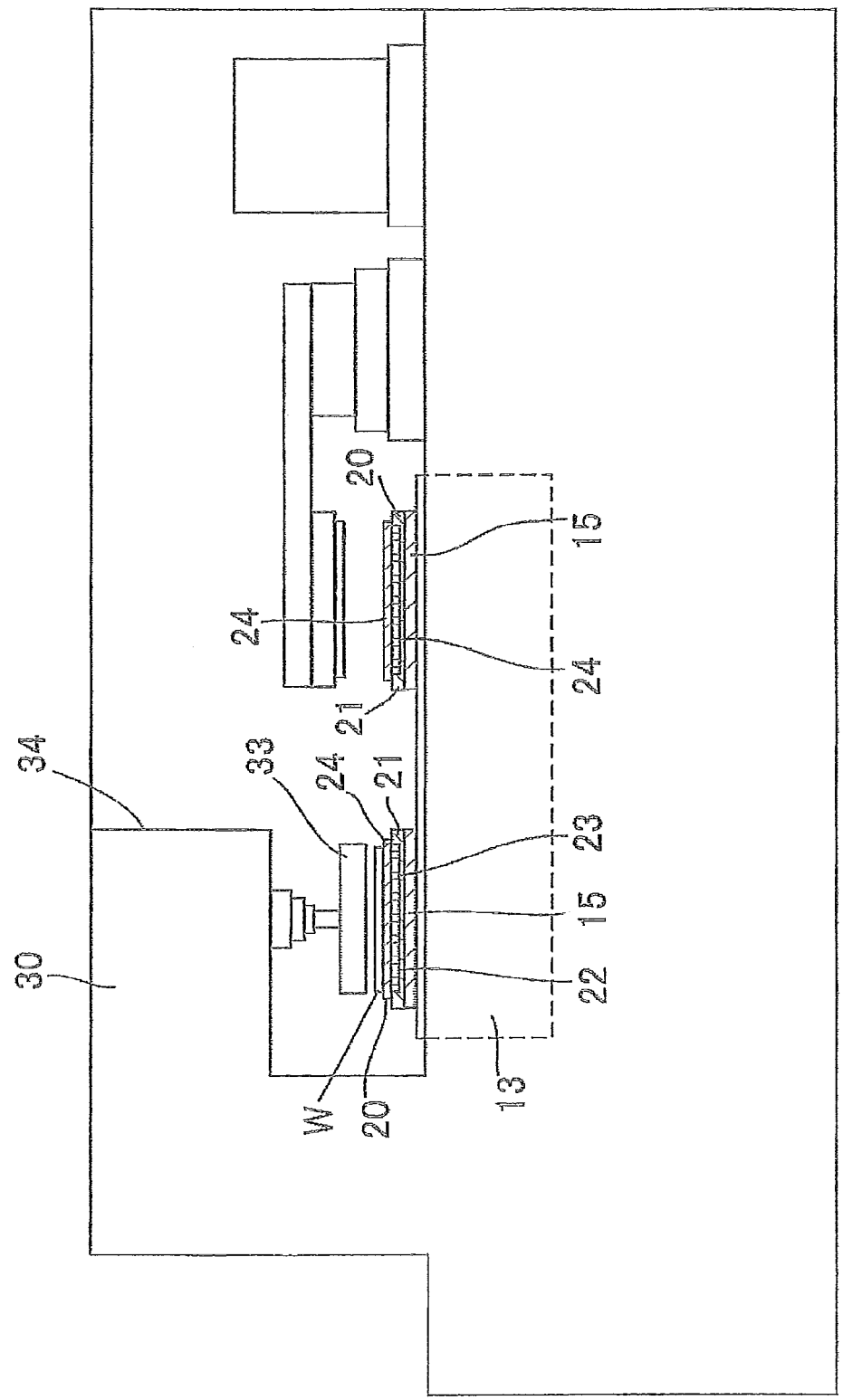
FIG. 2 is an illustrative side view schematically showing a backgrinding machine in an embodiment of a holding jig and a semiconductor wafer grinding method according to the present invention.
Figure 3:
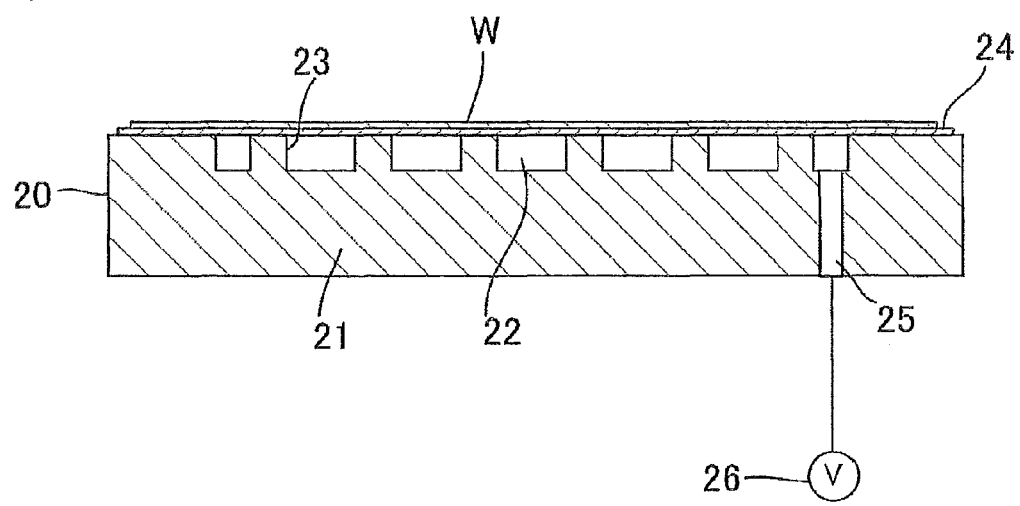
FIG. 3 is an illustrative sectional view schematically showing an embodiment of a holding jig according to the present invention.

Next, a preferred embodiment of the present invention will be described hereinbelow with reference to the drawings. As shown in FIGS. 1 to 3, a semiconductor wafer backgrinding machine 10 of the present embodiment includes: a table 13 set on a mount 11; a plurality of holding jigs 20, each rotatably arranged on the table 13 via a check table 15; a grinding device 30 for performing a grinding process by rough grinding and finish grinding of the rear side of a semiconductor wafer W held by holding jig 20; and a washing device 40 for ground semiconductor wafers W, and functions to perform backgrinding of 300 mm type semiconductor wafers W of about 775 μm thick to as thin as 100 μm or thinner.

As shown in FIGS. 1 and 2, mount 11 is formed in a shape elongated from the front to the rear (in the vertical direction in FIG. 1). A handling device 12 is arranged at the center in the front part of the working plane while circular table 13, with its top portion exposed and is rotatably mounted in the approximate center of the working plane. In the rear part of the working plane, grinding device 30 is arranged to stand so as to oppose the rear part of the table 13 surface from above. Loaded on both the left and right sides of handling device 12 are a wafer cassette 14 having a plurality of thick wafers W before backgrinding, accommodated in alignment and a wafer cassette 14A having a plurality of thin wafers after backgrinding, accommodated in alignment.

As shown in FIGS. 1 and 2, table 13 is formed in a disk shape, for example, made of a predetermined material, rotatably supporting a plurality of chuck tables 15 arranged apart from each other along the circumference on the exposed top surface thereof. While each chuck table 15 has holding jig 20 detachably mounted thereon, the table functions to change the position of holding jig 20 to the handling device 12 side or to the grinding device 30 side by rotation of a predetermined angle (see the arrow in FIG. 1).

Chuck table 15 is formed in a flat planer disk by fitting a porous ceramic disk into a frame of stainless steel, for example, and functions to detachably suction and hold holding jig 20 that is adhesively holding semiconductor wafer W, under decompression from an unillustrated vacuum device inside mount 11. The position of this chuck table 15 corresponding to an exhaust path 25 of holding jig 20 is clogged in order not to cause reduction in the pressure inside a concave 22 covered by a contact film 24.

Multiple holding jigs 20 are comprised of, for example, holding jig 20 for holding semiconductor wafer W to be rough ground, holding jig 20 for holding semiconductor wafer W to be finish ground and holding jig 20 for holding semiconductor wafer W put on standby, as shown in FIG. 1.

As shown in FIG. 3, each holding jig 20 has a simple structure comprising: a rigid base plate 21 placed on the chuck table 15 surface; a concave 22 formed in this base plate 21; a plurality of supporting projections 23 projected in this concave 22; a deformable contact film 24 that covers concave 22 and is supported by multiple supporting projections 23 to closely hold the pattern forming surface or the obverse surface of semiconductor wafer W in an attachable and detachable manner; and exhaust path 25 that draws air from the concave 22 covered by this contact film 24 to the outside so as to deform contact film 24 to thereby enable separation of semiconductor wafer W, and is accommodated in wafer cassettes 14, 14A or substrate storage container (e.g., FOUP, FOSB, etc.) as required.

Base plate 21 is formed as a flat thin plate of about 0.5 to 2.0 mm thick, made of a predetermined material and has a circular shape, when viewed from top, marginally greater than semiconductor wafer W. Examples of the materials for this base plate 21 include metals such as aluminum alloy, magnesium alloy, stainless steel, etc., resin molding materials such as polyamide (PA), polycarbonate (PC), polypropylene (PP), acrylic, polyvinyl chloride, etc., and glass.

Though any material of these can be selected for base plate 21, in view of assuring the rigidity of holding jig 20 and base plate 21a material that can present a bending elasticity based on ASTM D74 of 1 GPa or greater is preferably used. This is because if the bending elasticity is lower than 1 GPa, base plate 21 has to be made thicker, which causes problems in accommodating it into wafer cassette 14, 14A or a substrate storage container.

The thickness of base plate 21 is preferably specified to range from 0.5 to 2.0 mm or more preferably from 0.8 to 1.5 mm. This is because if the thickness of base plate 21 is less than 0.5 mm, semiconductor wafer W after it is thinned would flex or be bent resulting in breakage during handling of semiconductor wafer W. In contrast, when the thickness of base plate 21 exceeds 2.0 mm, it is caught causing hindrance when it is inserted into or taken out from wafer cassette 14, 14A or a substrate storage container.

Concave 22 is formed in a shallow depressed portion in the most area other than the periphery of the surface of the base plate 21 and has a circular shape, when viewed from top, having a size equal to greater than semiconductor wafer W. This concave 22 is preferably formed to be 0.05 to 0.5 mm in depth (or the projection height), more preferably has a depth of about 0.2 mm. Formed on the bottom surface are a plurality of supporting projections 23 for supporting contact film 24 from below.

Multiple supporting projections 23 are laid out regularly at intervals in the bottom surface of concave 22 by use of a molding technique, sandblast technique, etching technique, etc., and each supporting projection 23 is formed in a cylindrical shape having almost the same height and length with the depth of concave 22.

Contact film 24 is molded of ethylene-methyl methacrylate, silicone rubber, urethane elastomer, linear low density polyethylene (LLPE), ethylene-methyl methacrylate copolymer, olefin thermoplastic elastomer, propylene-olefin copolymer or the like so as to be a circular, when viewed from top, thin film having a size greater than semiconductor wafer W, and is bonded to the surface periphery of base plate 21 and also to the flat surface of multiple supporting projections 23 so as to cover concave 22, forming a sectioned space for air flow between itself and the bottom surface of the concave. As the material of contact film 24, ethylene-methyl methacrylate, which is excellent in flexibility, workability and tackiness, is the most suitable of the above listed materials.

Exhaust path 25 is bored on the outer side in the bottom part of base plate 21 as shown in FIGS. 2 and 3 with its downstream portion connected via a detachment table, detachment hand etc., to a vacuum pump 26, and functions to exhaust air inside concave 22 that is covered by contact film 24 and create a negative pressure state by activation of vacuum pump 26. This exhaustion of air causes flat contact film 24 to deform jaggedly toward the bottom surface of concave 22 following multiple supporting projections 23, hence partially separate from the pattern forming surface of semiconductor wafer W so as to facilitate detachment of semiconductor wafer W that was closely attached.

The size of exhaust path 25 is not particularly limited, but 2 mm or smaller is preferable so as not to adversely affect the backgrinding work. Though not illustrated, the detachment table and detachment hand are disposed together with vacuum pump 26 outside backgrinding machine 10, so as to detachably mount base plate 21 of holding jig 20 that is taken out from backgrinding machine 10.

As shown in FIGS. 1 and 2, grinding device 30 includes a rough grinder 32 for performing a rough grinding operation of the rear side of semiconductor wafer W from above by a rotary grinder 31 of about #320 to #360 with an abrasive liquid and a finish grinder 34 for performing a finish grinding operation of the rear side of semiconductor wafer W from above by a rotary grinder 33 of about #2000 with an abrasive liquid.

By the way, supporting projections 23 and contact film 24 of holding jig 20 preferably have the following features in view of preventing holding jig 20 from being damaged and smoothing and simplifying the backgrinding work.

First, the pitch between multiple supporting projections 23 (the distance from the center of a supporting projection 23 to the center of another supporting projection 23) is preferably 0.2 to 2.0 mm and optimally about 1 mm. This is because if the distance between supporting projection 23 and supporting projection 23 is less than 0.2 mm, contact film 24 is excessively extended upon detachment of semiconductor wafer W, causing contact film 24 to rupture and cleave as it is repeatedly used. Conversely, when the distance between supporting projection 23 and supporting projection 23 exceeds 2.0 mm, the thickness of semiconductor wafer W after grinding becomes markedly different between the portions on supporting projections 23 and the other area.

Here, the pitch between multiple supporting projections 23 can be freely changed within the range of 0.2 to 2.0 mm. However, when supporting projections 23 is thick, it is preferred that the pitch is made greater in view of facilitating detachment of semiconductor wafer W from contact film 24.

Each supporting projection 23 is preferably 0.05 to 1.0 mm wide and more preferably about 0.4 mm wide, and preferably 0.05 to 0.5 mm high and more preferably 0.2 mm high. Specifying the width of supporting projection 23 within the range of 0.05 to 1.0 mm is based on the reason that if the width of supporting projection 23 is less than 0.05 mm, supporting projections 23 might hole and damage the contact film 24 upon detachment of semiconductor wafer W and lowers the strength of supporting projection 23 itself.

Conversely, when the width of supporting projection 23 exceeds 1.0 mm, the attaching force of the supporting projection portion to semiconductor wafer W becomes greater than needed, causing difficulty in detaching semiconductor wafer W.

Specifying the height of supporting projection 23 within the range of 0.05 to 0.5 mm is based on the reason that if the height of supporting projection 23 is less than 0.05 mm, it becomes difficult to separate semiconductor wafer W from contact film 24. Conversely, when the height of supporting projection 23 exceeds 0.5 mm, semiconductor wafer W is ground more than needed at the points of the supporting projections during backgrinding or contact film 24 is extended more than needed, hindering attaching force to semiconductor wafer W.

Next, concerning contact film 24, the thickness of this contact film 24 is preferably 20 to 200 μm, or most suitably 50 to 100 μm. This is because if the thickness of contact film 24 is less than 20 μm, it presents poor durability when it is used repeatedly and cannot follow the bumpiness on the pattern forming surface of semiconductor wafer W. As a result, the abrasive liquid penetrates into between contact film 24 and semiconductor wafer W during backgrinding, contaminating the pattern forming surface of semiconductor wafer W.

Conversely, when the thickness of contact film 24 exceeds 200 μm, the film can follow the bumpiness on the pattern forming surface of semiconductor wafer W, but it takes long time to detach semiconductor wafer W from contact film 24.

The tensile strength at break of contact film 24 is preferably 5 MPa or greater, or more preferably 9 MPa or greater, based on the JIS K7127 test method. This is because if the tensile strength at break of contact film 24 is less than 5 MPa, there is a risk that contact film 24 breaks when it is deformed.

The elongation at break of the contact film layer is preferably 500% or greater, or more preferably 600% or greater, based on the JIS K7127 test method. This is because if the elongation at break of the contact film layer is less than 500%, there is a risk that contact film 24 cannot follow supporting projections 23 and is ruptured when it is deformed.

The bending elasticity at normal temperature of contact film 24 is preferably within the range of 10 to 100 MPa or more preferably 27 MPa, based on the ASTM D74 method. This is because if the bending elasticity of contact film 24 is less than 10 MPa, the area of contact film 24 other than those supported by supporting projections 23 slackens downwards due to gravity, causing hindrance to contact of semiconductor wafer W to contact film 24. Conversely, if the bending elasticity of contact film 24 exceeds 100 MPa, deformation of contact film 24 becomes hindered so that it is difficult to attach and detach semiconductor wafer W with respect to contact film 24.

Shear strength of contact film 24 is measured by enveloping contact film 24 over a well-known glass plate having a size of 30 mm long, 30 mm wide and 3 mm thick, and placing it on to the mirror surface of a silicon wafer, under application of a load of 900 g over the whole of the glass plate and contact film 24 for five seconds and then pushing the glass plate with a load in a direction parallel to the wafer; it is preferable that the load when the glass plate begins moving presents 20 N or greater, or it is more preferable that the load presents 35 N or greater.

This is because if the load when the body begins moving is less than 20 N, there is a risk that semiconductor wafer W detaches from contact film 24 and breaks when the operation has completed rough grinding of the rear side of semiconductor wafer W to transfer to finish grinding and thus the semiconductor wafer W becomes able to rotate after the pressure on the semiconductor wafer W applied by the rotary grindstones 3133 of grinding device 30 is released.

Attaching force of contact film 24 is measured as the peeling strength by placing contact film 24 that is cut at a width of 25 mm, over the wafer, pressing this contact film 24 to the mirror surface of the silicon wafer using a rubber roller so that air will not enter, then peeling contact film 24 after 20 minutes at a 180-degree angle and speed of 300 mm/min. It is preferable that the peeling strength presents 2N/25 mm or lower, it is most suitable that the peeling strength presents 1 N/25 mm or lower.

This is because if the peeling strength exceeds 2N/25 mm, it is difficult to detach semiconductor wafer W from contact film 24 even if air is exhausted from holding jig 20, hence hindering separation of semiconductor wafer W after backgrinding.

Additionally, when there are cases where static charge occurs when semiconductor wafer W is detached from contact film 24. When this electrification by peeling needs to be prevented, conductive carbon, carbon nanotube, a high-molecular type antistatic agent, conductive polymer, etc. may be blended as appropriate when contact film 24 is produced. Alternatively, another layer blended with these materials may be laminated. Other components are the same as those in the conventional example.

In the above configuration, when semiconductor wafer W is thinned by backgrinding to a thickness of 100 μm or below and divided into individual chips by a dicing process, holding jig 20 that closely holds the pattern forming surface of semiconductor wafer W is put, in advance, in wafer cassette 14, which in turn is set in backgrinding machine 10. Then, holding jig 20 is carried from wafer cassette 14 onto chuck table 15 of table 13 by handling device 12, so that holding jig 20 is put opposite to chuck table 15 and held by reduced pressure.

When holding jig 20 is held on chuck table 15, table 13 rotates to convey holding jig 20 from the handling device 12 side to the grinding device 30 side. Then holding jig 20 rotates together with chuck table 15 so that grinder 30 grinds the rear side of rotating semiconductor wafer W sequentially by rotary grindstones 31 and 33 of rough grinder 32 and finish grinder 34. After semiconductor wafer W has been thinned, holding jig 20 is accommodated into wafer cassette 14A.

Since contact film 24 has the above-described physical properties, semiconductor wafer W is closely held in a reliable manner during the grinding, hence the state of close contact will not be released even when the wafer is ground by rotary grind-stones 31 and 33. Further, since semiconductor wafer W is closely held by contact film 24 during the grinding process without use of any drive or energy, it is possible to expect sharp reduction of equipment and cost. Thereafter, the rear side of semiconductor wafer W is etched about 1 μm by chemical 41 if necessary so as to remove the damaged layer due to grinding. This removal of the damaged layer enhances the strength of the thinned chips and hence improves the reliability of the semiconductors.

Next, the etched rear side of semiconductor wafer W is fixed to hollow carrier jig 44 by a dicing tape as another adhesive tape used at the dicing process, and semiconductor wafer W is removed from holding jig 20. Specifically, when vacuum pump 26 that is connected via the detachment table and detachment hand and the like is driven, contact film 24 of holding jig 20 is deformed jaggedly toward the bottom surface of concave 22, facilitating peeling of semiconductor wafer W, whereby it is possible to easily remove the wafer from holding jig 20.

Figure 29:
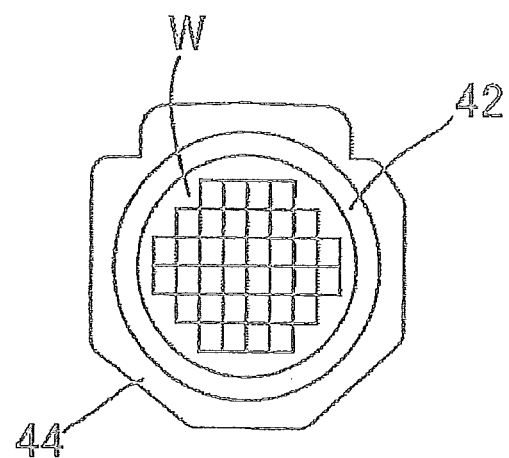
FIG. 29 is a top illustrative view showing a state in which a UV tape is adhered to a carrier jig at a dicing process.

When semiconductor wafer W is supported by carrier jig 44 by means of the dicing tape (see FIG. 29), extra part of the dicing tape is cut off, so that semiconductor wafer W disposed in the hollowed part of carrier jig 44 can be separated into individual chips using a grindstone.

According to the above configuration, since reusable holding jig 20 is used instead of single-use protection sheet 1, it is no longer necessary to adhere protection sheets 1 over pattern forming surfaces of semiconductor wafers W, one by one. Accordingly, it is possible to prevent increase of waste due to disposal of protection sheets 1 and completely eliminate the problem that the flexibility is narrowed by material selection of protection sheet 1.

Further, since no adhesive is used for contact film 24, so-called "adhesive residue" will not occur at all. In addition, since protection sheet 1 can be omitted, there is no possibility of adhesive residue, it is hence possible to markedly efficiently exclude the cause of conduction failure due to adhesive remaining on the pattern forming surface of semiconductor wafer W.

Further, even if semiconductor wafer W is thinned to 75 μm or thinner, it is possible to greatly expect protection against breakage of semiconductor wafer W by attaching force of contact film 24. Since contact film 24 is not a simple elastomer but is an elastomer film, it is possible to repeatedly use it reliably within its elastically deformable range. Moreover, when the elastomer film is specified to be 20 to 50 μm thick, it is possible to reduce the time required for removing semiconductor wafer W.

Further, since multiple supporting projections 23 for closely supporting contact film 24 are arranged in the bottom surface of concave 22, it is possible to reliably prevent contact film 24 from being depressed excessively over a wide range and prevent semiconductor wafer W from being inclined out of position or being displaced and dislodging.

Figure 4:
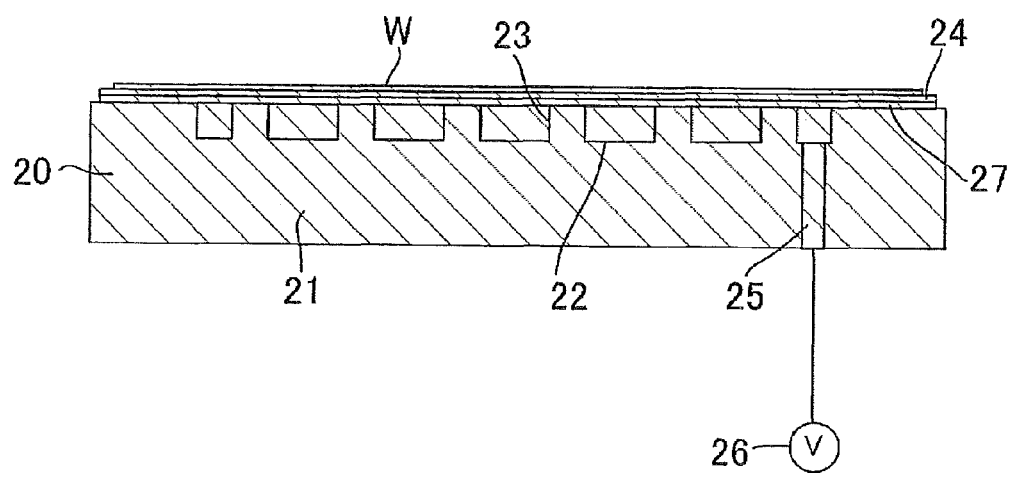
FIG. 4 is an illustrative sectional view schematically showing another embodiment of a holding jig according to the present invention.

Next, FIG. 4 shows another embodiment of the present invention. In this case, an elastically deformable antistatic layer 27 is laid over and bonded to the rear side of contact film 24 of holding jig 20 so that the antistatic layer will not come in contact with semiconductor wafer W, whereby contact film 24 and antistatic layer 27 are integrated.

Antistatic layer 27 is formed of, for example, a film of ethylene-methyl methacrylate, a thin elastomer or the like, added with an antistatic resin having quaternary ammonium salt shown in chemical formula I as its side chains, organic conductive polymer, metal oxide and/or carbon. Other components are the same as in the above embodiment, so that description is omitted.

[Chemical 1]

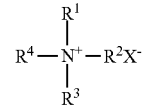

in the formula, $R^1$, $R^2$ and $R^3$ each represent an alkyl group containing one to ten carbon atoms while $R^4$ represents an alkylene group containing one to ten carbon atoms, and $X^-$ represents an anion.

Also in this embodiment, the same operation and effect as that of the above embodiment can be expected. Further, since contact film 24 is formed to have a multi-layered structure including antistatic layer 27 which is unlikely to store static charge, it is obvious that contact film 24 can be diversified and improved in durability in addition to prevention against electrification by peeling.

Though, in the above embodiment, contact film 24 that covers concave 22 is simply shown, it is also possible to tint contact film 24 with a dark color such as black, dark blue, brown etc., so as to prevent to be hindered image analysis by reflection of light to visualize dirtiness. Further, though the rear side of semiconductor wafer W is etched by chemical 41, the damaged layer may be removed by polishing, which makes wastewater treatment easy.

Referring next to the drawings, the semiconductor wafer protecting structure and a semiconductor wafer grinding method according to the present invention will be described illustratively.

Figure 5:
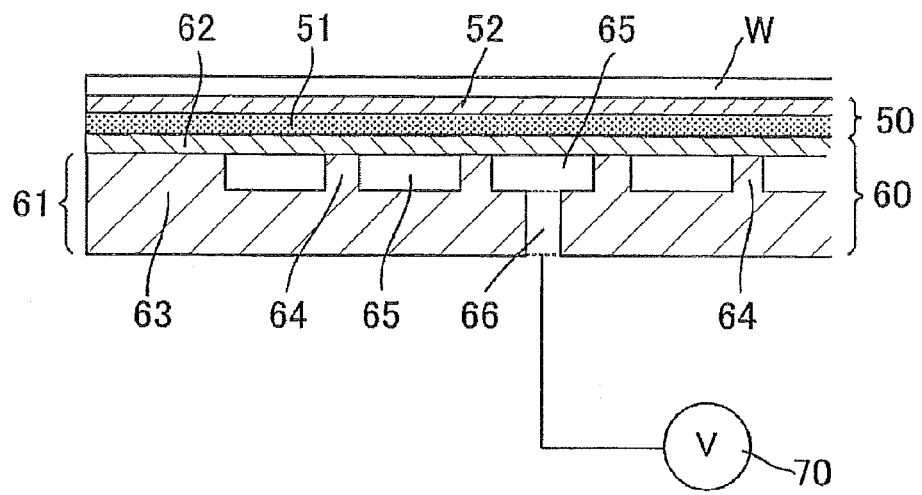
FIG. 5 is a schematic sectional view showing one example of a semiconductor wafer protecting structure according to the present invention.
Figure 6:
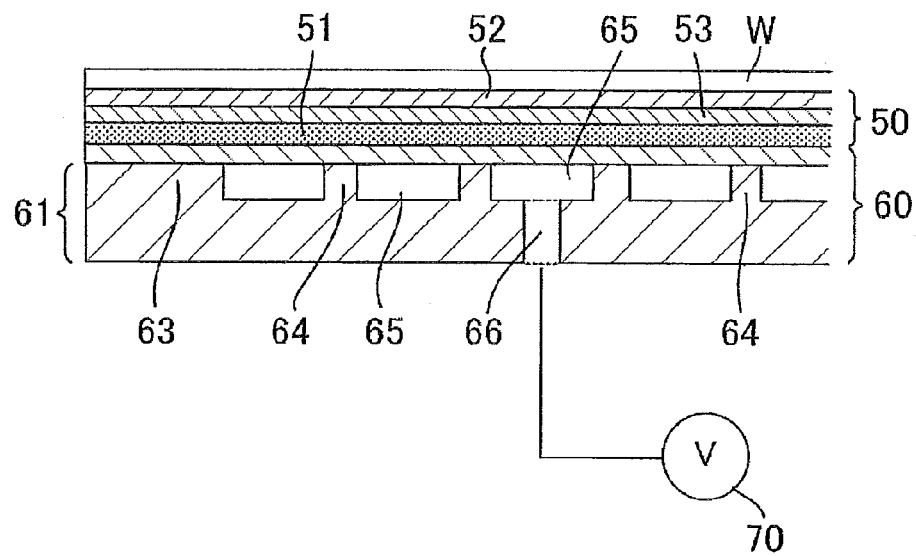
FIG. 6 is a schematic sectional view showing one example of a semiconductor wafer protecting structure according to the present invention.

In the semiconductor wafer protecting structure according to the present invention, an adhesive sheet 50 is laminated on the circuit surface of semiconductor wafer W, then a fixing jig 60 laminated in this order, as shown in FIGS. 5 and 6.

Figure 7:
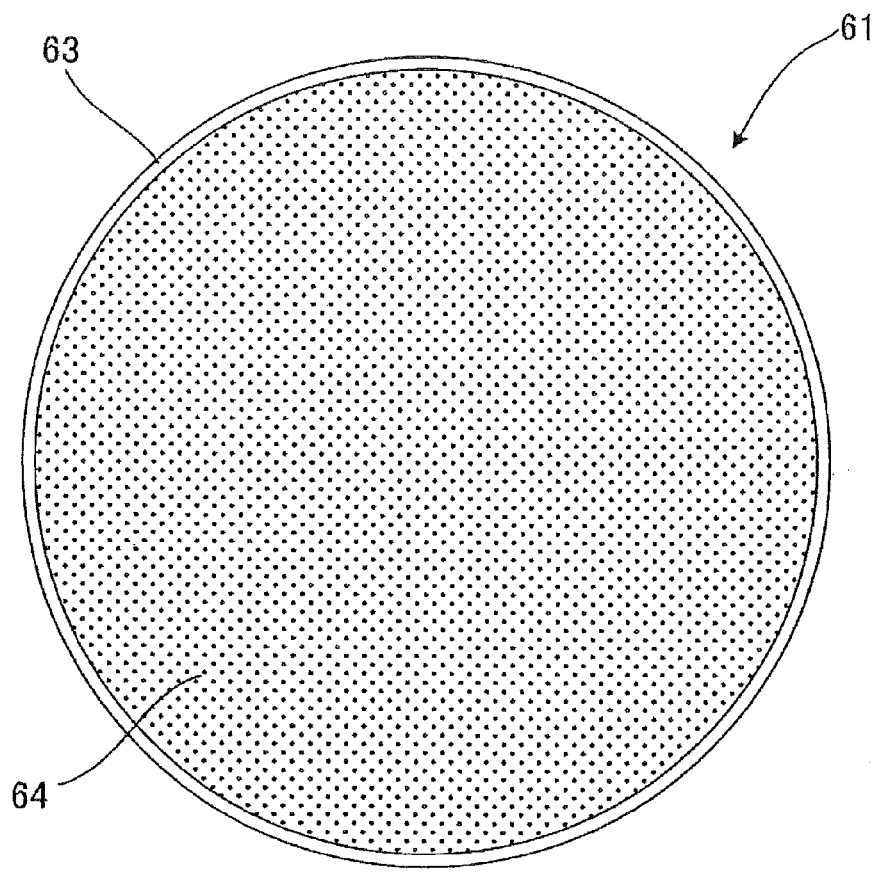
FIG. 7 is a schematic top view showing a jig base that forms a semiconductor wafer protecting structure according to the present invention.
Figure 8:
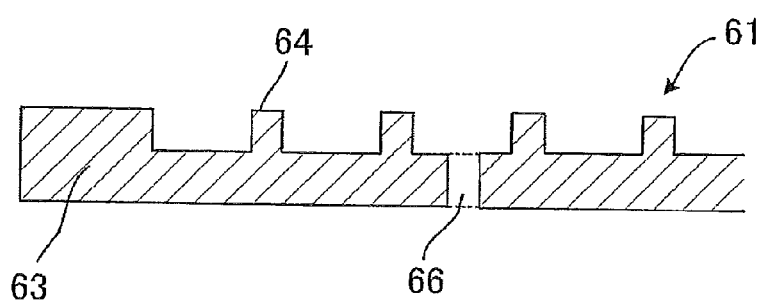
FIG. 8 is a schematic sectional view showing a jig base that forms a semiconductor wafer protecting structure according to the present invention.
Figure 9:
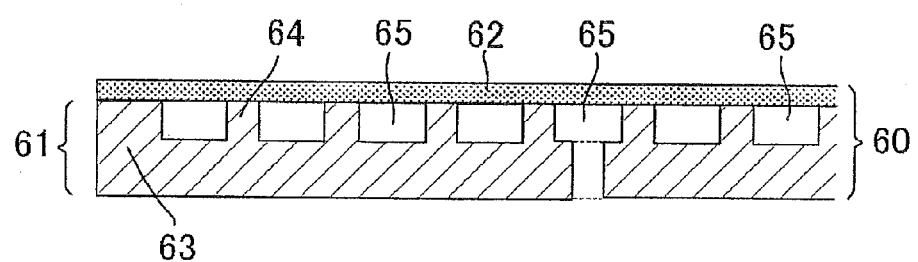
FIG. 9 is a schematic sectional view showing a jig base that forms a fixing jig used in the present invention.
Figure 10:
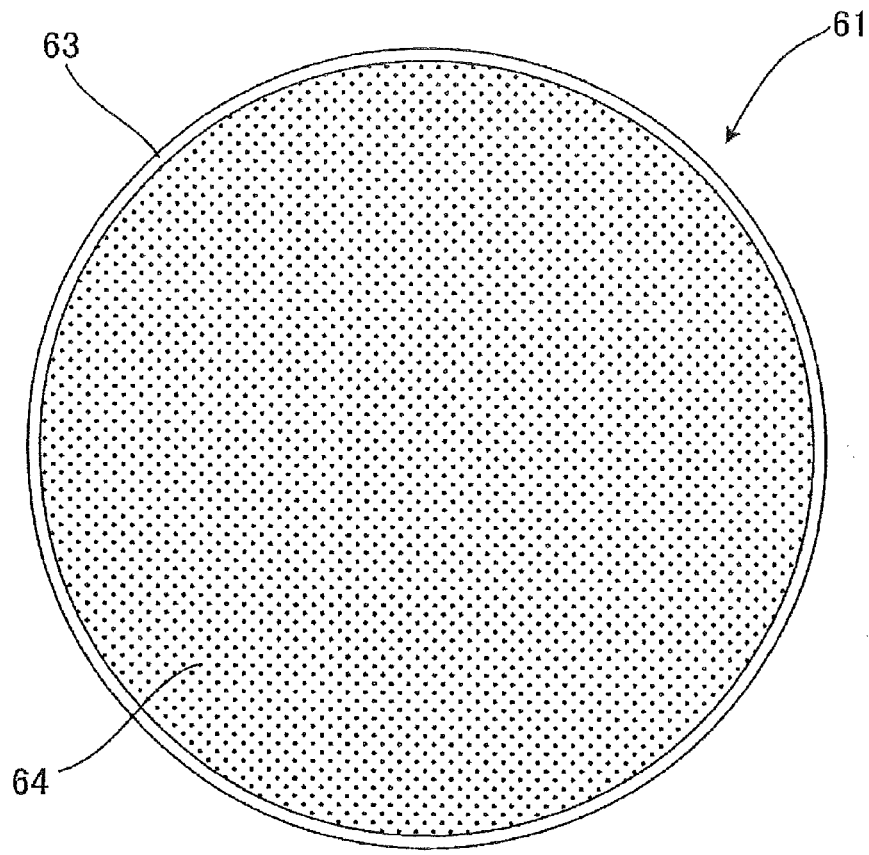
FIG. 10 is a schematic sectional view showing one step of a semiconductor chip fabrication method according to the present invention.
Figure 11:
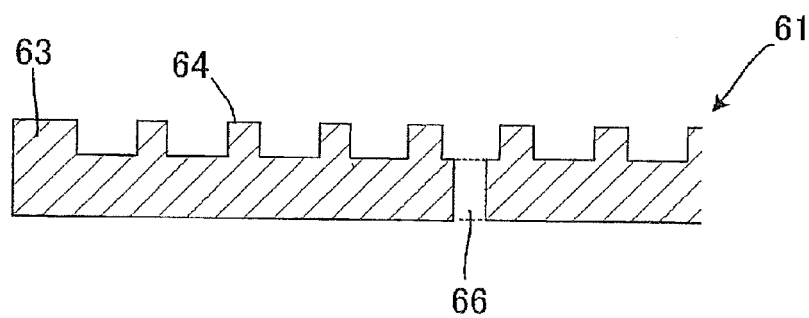
FIG. 11 is a schematic sectional view showing one step of a semiconductor chip fabrication method according to the present invention.

Fixing jig 60 is comprised of a jig base 61 and contact layer 62. Jig base 61 may be shaped in an approximately circular form, approximately elliptic form, approximately rectangular form or approximately polygonal form, and an approximately circular form is preferable. As shown in FIGS. 7 and 8, a plurality of projections 64 that stand upward are formed at intervals on one surface of jig base 61. Though the shape of projection 64 is not particularly limited, cylindrical or truncated cone shape is preferred. A side wall 63 approximately as high as projection 64 is formed along the periphery of the surface having these projections 64.

Further, contact layer 62 is layered over the surface with projections 64. This contact layer 62 is bonded to the top of side wall 63 while contact layer 62 either may be, or need not be bonded to the top of projections 64. On the side of jig base 61 with projections 64, or i.e., between jig base 61, and contact layer 62, a sectioned space 65 is formed by projections 64, side wall 63 and contact layer 62. On the other side of jig base 61 with no projections 64, a passage hole 66 that penetrates from the outside of this side, to sectioned space 65 is formed in the thickness direction of jig base 61.

Here, at least one passage hole 66 needs to be formed in jig base 61, and a plurality of passage holes may be formed. Instead of the passage hole 66 formed in jig base 61 toward the surface with no projections 64, a passage hole 66 may be extended in jig base 61 horizontally while an opening is formed in side wall 63 of jig base 61 so that an attachable and detachable vacuum device 70 is connected to the opening of passage hole 66, whereby it is possible to deform contact layer 62 jaggedly by suctioning air from section space 65.

Though the material of jig base 61 is not particularly limited as long as it is excellent in mechanical strength, examples may include thermoplastic resins such as polycarbonate, polypropylene, polyethylene, polyethylene terephthalate resin, acrylic resin, polyvinyl chloride and the like; metallic materials such as aluminum alloy, magnesium alloy, stainless steel and the like; inorganic materials such as glass etc.; and organic-inorganic composites such as glass fiber-reinforced epoxy resin etc. The bending elasticity of jig base 61 is preferably 1 GPa or greater. If the bending elasticity is specified as this, it is possible to provide rigidity without making jig base 61 thicker than needed. Use of the material as above makes it possible to adequately support semiconductor wafer W without flexion after backgrinding of the semiconductor wafer W.

The outside diameter of jig base 61 is preferably approximately equal to the outside diameter of semiconductor wafer W or greater than the outside diameter of semiconductor wafer W. As long as jig base 61 has an outside diameter that can support the maximum diameter (e.g., 300 mm diameter) of semiconductor wafers W of standard sizes, the jig base can be applied to all the semiconductor wafers W that is smaller than that. Further, the thickness of jig base 61 is preferably 0.5 to 2.0 mm, more preferably 0.5 to 1.0 mm. The thickness of jig base 61 falling within the above range makes it possible to adequately support semiconductor wafer W without flexion after backgrinding of the semiconductor wafer W.

The height of projection 64 and side wall 63 is preferably 0.05 to 0.5 mm. The diameter of the top of projection 64 is preferably 0.05 to 1.0 mm. The distance between projections is preferably 0.2 to 2.0 mm. When the size of projection 64 and the distance between projections 64 are specified within the above ranges, it is possible to adequately deform contact layer 62 jaggedly by suctioning air from sectioned space 65 by vacuum device 70, whereby semiconductor wafer W attached with adhesive sheet 50 can be easily separated from contact layer 62. Further, it is possible to restore contact layer 62 into its original flat state even after the contact layer has been repeatedly deformed jaggedly many times. The diameter of passage hole 66 is not particularly limited, but 2 mm or smaller is preferable.

This jig base 61 can be produced so that the bottom part of jig base 61, side wall 63 and projections 64 are thermally formed of a thermoplastic resin using a die into an integrated structure, can be produced by forming side wall 63 and projections 64 on a flat circular plate or can be produced by forming projections 64 on the surface inside the hollowed portion of a concave disk.

As the method of forming projections 64, a method of depositing metal in a predetermined pattern by electroforming, a method of forming projections 64 by screen printing, a method of forming projections 64 by exposure and development of photoresist coated over a flat disk, and the like can be considered. It is also possible to fabricate jig base 61 by erosion and removal of the surface of a flat disk of metal other than the projection forming parts by etching, by removal of the surface of a flat disk other than the projection forming parts by sandblasting and other method.

Here, passage hole 66 may be formed in advance before forming projections 64 or may be formed afterwards. It may be formed simultaneously when jig base 61 is formed.

Contact layer 62 is formed over the surface having projections 64 of jig base 61. As the material for this contact layer 62, urethane-based, acrylic, fluoro-based or silicone-based elastomers, which are excellent in flexibility, pliability, heat resistance, elasticity, stickiness and the like, can be considered. Various additives such as a reinforcing filler, hydrophobic silica and the like can be added to the elastomer, if necessary.

Contact layer 62 is preferably formed of a flat plate having approximately the same shape as jig base 61, has approximately the same outside diameter as jig base 61, and is preferably 20 to 200 μm thick. If the thickness of contact layer 62 is less than 20 μm, the mechanical durability to repeated suctioning may become poor. In contrast, the thickness of contact layer 62 exceeding 200 μm is not preferable because there are cases where it takes a markedly long time to release the contact layer from adhesive sheet 50 by suction.

The tensile strength at break of contact layer 62 is preferably 5 MPa or greater. The elongation at break of the contact film layer is preferably 500% or greater. When the tensile strength at break and elongation at break are specified to be within the above ranges, it is possible to restore contact layer 62 into its original flat state without causing any rapture or slack of contact layer 62 even after the contact layer has been repeatedly deformed many times.

The bending elasticity of contact layer 62 preferably falls within the range of 10 to 100 MPa. When the bending elasticity of contact layer 62 is less than 10 MPa, the area of contact layer 62 other than the points in contact with projections 64 slackens due to gravity, causing a risk that the contact layer cannot closely attach to semiconductor wafer W. On the other hand, when the bending elasticity exceeds 100 MPa, it becomes difficult to cause deformation by suctioning, causing a risk that semiconductor wafer W cannot be released easily.

Shear strength of contact layer 62 to the surface on the side in contact with adhesive sheet 50 is preferably 35 N or greater. When it is less than 35 N, there is a risk that semiconductor wafer W together with adhesive sheet 50 peels off and breaks itself if a force is acted in the shearing direction of semiconductor wafer W (in the direction horizontal to the wafer surface). In the present invention, the shear strength is a value that is measured between contact layer 62 and the mirror surface of the semiconductor wafer. That is, the value is the load that needs to be applied when a well-known glass plate having a size of 30 mm long, 30 mm wide and 3 mm thick, to which contact layer 62 is applied, being placed on a mirror wafer of silicon under application of a load of 900 g over the whole of the glass plate and contact layer 62 for five seconds, is pushed in a direction parallel to the mirror wafer and the glass plate begins moving.

Further, attaching force of contact layer 62 is preferably equal to or lower than 2N/25 mm. If it exceeds this, the attaching force between contact layer 62 and base 51 of adhesive sheet 50 becomes too strong, causing a blocking state and giving rise to a risk that the contact layer 62 cannot be separated by suctioning. In the present invention, the attaching force is the peeling strength measured when contact layer 62 being applied to the mirror surface of the wafer is peeled off.

This contact layer 62 can be prepared by fabricating a film of the aforementioned elastomer, in advance, by a calendering technique, pressing technique, coating technique, printing technique or the like, then bonding the elastomer film onto, at least, the top of side wall 63 of jig base 61, so as to form sectioned space 65. Examples of the methods for bonding the contact layer 62 include a bonding method by use of such an adhesive as acrylic resin, polyester resin, epoxy resin, silicone resin or elastomer resin and a bonding method by heat sealing when contact layer 62 has heat sealing properties.

The surface of contact layer 62 may be subjected to a non-sticky treatment. In particular, it is preferred that only the top of projections 64 that are in contact with adhesive sheet 50 when the contact layer is jaggedly deformed is adapted to being non-sticky. With this treatment, the area on the contact layer surface that is not non-sticky treated closely attaches adhesive sheet 50 before contact layer 62 deforms, whereas the jagged deformed adhesive layer 62 is in contact with adhesive sheet 50 only at top ends of projections 64, i.e., the non-sticky projected surface. Accordingly, it is possible to release semiconductor wafer W attached with adhesive sheet 50 further easily from contact layer 62.

Examples of the methods for non-sticky treatment may include: a physically roughening method whereby contact layer 62 is deformed jaggedly by suctioning air from sectioned space 65 using vacuum device 70 and then roughed on the top ends of the projections by a grindstone roller and the like; a UV-treatment method; a laminating method of laminating a non-sticky rubber; and a coating method of coating a non-sticky paint. It is also possible to form non-sticky portions in a cross-shaped pattern that passes through the center of contact layer 62 instead of forming them at the projected portions as mentioned above. The surface roughness of the non-sticky portion is preferably 1.6 μm or greater or more preferably ranges from 1.6 to 12.5 μm, in terms of arithmetic mean roughness Ra. Roughening the non-sticky portions with the surface roughness falling within the above range enables easy release of semiconductor wafer W attached with adhesive sheet 50 from contact layer 62 without deteriorating contact layer 62.

The above holding jig 20 may also be used as the fixing jig 60 used in the semiconductor wafer protecting structure and the semiconductor wafer grinding method of the present invention.

The semiconductor wafer protecting structure of the present invention is formed by laminating adhesive sheet 50 over contact layer 62. Adhesive sheet 50 is preferably formed of, at least a base 51 and an adhesive layer 52, as shown in FIGS. 5 and 6. It is further preferable that a middle layer 53 is interposed between base 51 and adhesive layer 52 as shown in FIG. 6.

Adhesive sheet 50 is preferred to have excellent stress relaxation. The stress relaxation ratio of the sheet in the case of 10% extension at a tensile test after one minutes should be 40% or greater, preferably 50% or greater, and more preferably 60% or greater. It is more preferable that the stress relaxation ratio is higher. Though the upper limit is 100%, theoretically, 99.9%, 99% or 95% is preferable under certain circumstances. Application of adhesive sheet 50 having such excellent stress relaxation, residual stress will rapidly attenuate. Accordingly, even a semiconductor wafer W that has been ground to be extremely thin and hence is fragile can be held without causing flexion because the residual stress of adhesive sheet 50 has attenuated to a very low level after fixing jig 60 and adhesive sheet 50 were separated from each other.

Base 51 used for adhesive sheet 50 is not particularly limited as long as it is a resin sheet. Examples of the resin sheet include: resin films of polyolefins such as low density polyethylene, linear low density polyethylene, polypropylene, polybutene, etc., ethylene copolymers such as ethylene-vinylacetate copolymer, ethylene-(meth)acrylate copolymer, ethylene-(meth)acrylic acid ester copolymer, etc., polyesters such as polyethylene terephthalate, polyethylene naphthalate etc., polyvinyl chloride, acrylic rubber, polyamide, urethane, polyimide and the like. Base 51 may be of a single layer or of a laminated structure. Further, the base may be a sheet that has undergone a cross-linking treatment.

The thickness of base 51 is preferably 30 to 1,000 μm, more preferably 50 to 800 μm, and particularly preferably 80 to 500 μm. Further, at least the side of base 51 that is in contact with contact layer 62 of fixing jig 60 preferably has a surface energy of 20 to 60 mN/m, more preferably 25 to 50 mN/m. The surface energy falling within the above range optimizes its attaching force to contact layer 62, neither blocking nor dislodging of the wafer due to insufficient adhesion will occur.

The surface roughness (arithmetic mean roughness Ra) of base 51 is preferably 1.0 μm or lower, more preferably 0.2 μm or lower. The arithmetic mean roughness Ra falling within the above range provides stable adhesion since there is no cause of lowering the adhesion between contact layer 62 and adhesive sheet 50.

Further, the maximum value of tan δ of dynamic viscoelasticity of base 51 in the temperature range of −5 deg. C. to 80 deg. C. is preferably 0.5 or greater, more preferably 0.5 to 2.0 and particularly preferably 0.7 to 1.8. Adhesive sheet 50 with maximum of tan δ falling within the above range makes it possible to disperse pressure difference due to bumpiness even if the sheet needs to protect a semiconductor wafer W of which the circuit surface is formed of unevenness such as bumps, hence makes it difficult to form dimples on the ground surface. Dimpling on the ground surface makes semiconductor chips prone to be impaired, hence a semiconductor device with such a chip will present poor reliability.

The method of making base 51 meet the above physical properties is not particular limited. The resin used for base 51 itself may present the above physical properties or the base that is added with other additives may present the above physical properties. Further, base 51 may be a film that is cured after film formation of a curable resin or may be a film that is film-formed from a thermoplastic resin.

As the curable resins that present the above physical properties, photo curable resins, thermo curable resins and the like are used and photo curable resins are preferably used. As preferable examples of photo curable resins, resin compositions that essentially consist of photo polymerizing urethane acrylate oligomers, polyene/thiol resins and the like are preferably used.

Urethane acrylate oligomers can be obtained by reacting (meth)acrylates having hydroxyl group with terminal isocyanate urethane prepolymers that are obtained by reacting polyester type or polyether type polyol compounds with polyvalent isocyanate compounds and the like.

The molecular weight of urethane acrylate oligomers preferably used in the present invention falls within the range of 1,000 to 50,000, more preferably falls within the range of 2,000 to 30,000. As to the aforementioned urethane acrylate oligomers, one kind of oligomer may be used alone or two or more kinds may be used in combination.

Since it is often difficult to perform film forming using the aforementioned urethane acrylate oligomers alone, usually the oligomers are diluted by photo-polymerizing monomers to form a film and then the film is cured to obtain the base.

When base 51 is formed from the aforementioned photo-curable resin, it is possible to reduce the polymerization curing time by photo irradiation and the amount of photo irradiation, by blending a photo polymerization initiator into the resin. Examples of this photo polymerization initiator include: photo initiators such as benzoin compounds, acetophenone compounds, acylphosphine oxide compounds, titanocene compounds, tioxanthone compounds, peroxide compounds, etc.; and photosensitizers such as amine, quinone, etc. Specifically, 1-hydroxy cyclohexyl phenylketone, benzoin, benzoin methylether, benzoin ethylether, benzoin isopropylether, benzyl diphenyl sulfide, tetramethyl thiuram monosulfide, azobisisobutyronitril, dibenzyl, diacetyl, B-chloroanthraquinone, etc. can be listed.

The use amount of the photo-polymerization initiator is preferably 0.05 to 15 parts by weight, more preferably 0.1 to 10 parts by weights, particularly preferably 0.5 to 5 parts by weight, relative to 100 parts by weight of the total resin.

The above curable resin can be prepared by selecting oligomers and monomers in various combinations so that the resultant presents the aforementioned physical properties.

Also, it is preferable to add additives that can improve the tan δ value into the above resin. As the additives that can improve the tan δ value, inorganic fillers such as calcium carbonate, silica, mica, etc., and metal fillers such as iron, lead, etc., can be mentioned, and in particular, metal fillers that are high in specific weight are effective. Further, the aforementioned resin may include inorganic fillers such as calcium carbonate, silica, mica and the like, metal fillers such as iron, lead, etc., coloring agent such as pigments, dyes, etc., and other additives.

Base 51 can be fabricated by casting the resin in a fluid form (resin before curing, resin solution or the like) over the contact layer 62 in a film-like form, then developing it into film by a predetermined means. This production method lowers stress acting on the resin and reduces generation of fish-eyes during film-forming. Further, it also presents high uniformity of film thickness so that the thickness precision usually falls within 2%. As the other film forming methods, methods of producing film base 51 as a single layer film by T-die or inflation extruding or by calendering can be listed.

In the present invention, adhesive sheet 50 can be obtained by forming an aftermentioned adhesive layer 52 and middle layer 53 on the thus obtained base 51. Adhesive layer 52 can be formed from various kinds of conventionally known pressure sensitive adhesives. Though there is no limitation on the adhesive, adhesives of a rubber type, acrylic type, silicone type, polyvinyl ether etc. can be used, for example. Energy ray-curable type adhesives, heat-foaming type adhesives and water swelling type adhesives can also be used. In the present invention, energy ray-curable type adhesives, particularly UV curable type adhesives are particularly preferably used.

An typical energy ray-curable type adhesive is essentially formed of an acrylic adhesive and an energy ray polymerizable compound. As an energy ray polymerizable compound used for an energy ray-curable type adhesive, low-molecular weight compounds having at least two photo-polymerizing carbon-carbon double bonds in the molecule. Specifically, trimethylolpropane triacrylate, pentaerythritol triacrylate, pentaerythritol tetraacrylate, dipentaerythritol monohydroxy pentaacrylate, dipentaerythritol hexaacrylate, or 1,4-butyleneglycol diacrylate, 1,6-hexanediol diacrylate, polyethyleneglycol diacrylate, oligoester acrylate, urethane acrylate and the like are used.

As to the compounded ratio between the acrylic adhesive and the energy ray-polymerizable compound in the energy ray-curable type adhesive, 10 to 1,000 parts by weight, preferably 20 to 500 parts by weight, particularly preferably, 50 to 200 parts by weight of the energy ray-polymerizing compound is used for 100 parts by weight of the acrylic adhesive. In this case, the resultant adhesive sheet 50 presents a strong adhesion at the initial period and a markedly lowered adhesion after irradiation with energy rays. As a result, it is easy to perform peeling at the interface between semiconductor wafer W and the energy ray-curable type adhesive layer after the completion of backgrinding.

Further, the energy ray-curable type adhesive may also be formed of an energy ray-curable type copolymer having energy ray-polymerizable groups as its side chains. Energy ray-curable type copolymers of this kind have both adhesive and energy ray-curable properties.

It is possible to shorten the polymerization curing time by photo irradiation and the degree of photo irradiation by blending a photo polymerization initiator into the energy ray-curable type adhesive. Examples of such photo polymerization initiators include: photo initiators such as benzoin compounds, acetophenone compounds, acylphosphine oxide compounds, titanocene compounds, tioxanthone compounds, peroxide compounds, etc.; and photosensitizers such as amine, quinone, etc. Specifically, 1-hydroxy cyclohexyl phenylketone, benzoin, benzoin methylether, benzoin ethylether, benzoin isopropylether, benzyl diphenyl sulfide, tetramethyl thiuram monosulfide, azobisisobutyronitril, dibenzyl, diacetyl, B-chloroanthraquinone, etc. can be listed.

The use amount of the photo polymerization initiator is preferably 0.05 to 15 parts by weight, more preferably 0.1 to 10 parts by weights, particularly preferably 0.5 to 5 parts by weight, relative to 100 parts by weight of the total adhesive. In order to partially cross-link the polymer component in the above adhesive, a cross-linker may be used. As this cross-linker, epoxy type cross-linker, isocyanate type cross-linker, methylol type cross-linker, chelate type cross-linker, aziridine type cross-linker and the like are used for example.

The acrylic energy ray-curable type adhesive as above provides adequate adhesion to semiconductor wafer W before irradiation of energy rays and a markedly lowered adhesion after irradiation of energy rays. That is, this makes it possible to closely attach adhesive sheet 50 and semiconductor wafer W with a sufficient adhesive force before irradiation of energy rays to protect the surface and enables easy peeling of the adhesive sheet from the ground semiconductor wafer W after irradiation of energy rays.

The thickness of the adhesive layer 52 is usually about 3 to 100 μm, preferably about 10 to 50 μm, though it depends on the material.

The elasticity of adhesive layer 52 at 23 deg. C. preferably ranges from $5.0 \times 10^4$ to $1.0 \times 10^8$ Pa, more preferably from $7.0 \times 10^4$ to $8.0 \times 10^7$ Pa, and particularly preferably from $8.0 \times 10^4$ to $5.0 \times 10^7$ Pa. Further, when adhesive sheet 50 has middle layer 53, the elasticity of adhesive layer 52 at 23 deg. C. preferably ranges from $5.0 \times 10^4$ to $1.0 \times 10^7$ Pa, more preferably from $6.0 \times 10^4$ to $5.0 \times 10^6$ Pa, and particularly preferably from $8.0\times10^4$ to $1.0\times10^6$ Pa. It should be noted that when adhesive layer 52 is formed of energy ray curable adhesive, the above elasticity represents the elasticity of the adhesive layer before irradiation of energy rays.

When the elasticity of adhesive layer 52 at 23 deg. C. is lower than $5.0\times10^4$ Pa, the adhesive is liable to ooze out from the edge of adhesive sheet 50 and the layer is likely to be sheared by the force from grinding due to insufficient cohesion, increasing variation in the thickness of semiconductor wafer W after grinding. Further, if the adhesive that has sunk in the indentations formed between bumps on the circuit surface of semiconductor wafer W is sheared, the risk of the adhesive stagnating on the wafer surface becomes higher. In contrast, when the elasticity of adhesive layer 52 at 23 deg. C. exceeds $1.0\times10^8$ Pa, adhesive layer 52 becomes hard so that it is difficult to follow the unevenness of the bumps. As a result, the problem that the variation in the thickness of semiconductor wafer W after grinding becomes greater, the problem that cooling water in the grinding process penetrates into the gap between bumps and adhesive sheet 50 and other problems tend to occur.

The elasticity of middle layer 53, which is provided as required, at 23 deg. C., is specified to be equal to or lower than the elasticity of adhesive layer 52 at 23 deg. C., preferably falling within the range of 1 to 100% of the elasticity of adhesive layer 52, more preferably within 10 to 90%, and particularly preferably within 30 to 80%.

With the relationship as to elasticity at 23 deg. C. between adhesive layer 52 and middle layer 53 is specified as above, it is possible to sufficiently follow the bumpiness even when the semiconductor wafer circuit has bumps with height difference exceeding 30 μm. Besides, since the shearing force acting on adhesive layer 52 is also dispersed, the adhesive tends not to remain when the sheet is peeled off. Further, it is possible to adhere the sheet without producing thickness difference between the areas with full of bumps and the areas with few bumps on the wafer surface.

The material for middle layer 53 is not particularly limited as long as it satisfies the aforementioned physical properties. For example, various adhesive compositions of acryl type, rubber type, silicone type, as well as UV curable type resins and thermoplastic elastomers etc., used in preparation for base 51 can be used.

Further, the top surface of the above middle layer 53, or the surface on which adhesive layer 52 is formed, may be subjected to corona discharge treatment or may be formed with a primer coat or any other layer in order to increase adhesion with the adhesive.

The total thickness of middle layer 53 and adhesive layer 52 is determined as appropriate, taking into account the height of bumps on the object to which adhesive sheet 50 is applied, the bump configuration, the pitch between bumps etc. Typically, the total thickness of middle layer 53 and adhesive layer 52 is specified to be equal to or greater than 50% and preferably 100 to 200% of the bump height. Specifying the total thickness of middle layer 53 and adhesive layer 52 as above enables adhesive sheet 50 to follow the bumpiness on the circuit surface and thereby eliminate the undulation. Accordingly, the thickness of middle layer 53 is specified to fall within the range of 5 to 500 μm for example, depending on the undulating height of the circuit surface.

Adhesive sheet 50 can be obtained by forming adhesive layer 52 by applying the aforementioned adhesive of an appropriate thickness over base 51 in a generally known method such as using a knife coater, roll coater, gravure coater, die coater, reverse coater, etc. and dried, and then laminating a release liner over adhesive layer 52 as required.

On the contrary, it is also possible to obtain adhesive sheet 50 by forming adhesive layer 52 over the release treatment surface of a release liner and then laminating it to base 51.

When middle layer 53 is provided, the resin for forming middle layer 53 is applied and then is dried or cured by the necessary means to form middle layer 53. Then adhesive layer 52 is formed over this middle layer 53 by the aforementioned method to thereby provide adhesive sheet 50a with middle layer 53 formed therein. It is also possible to produce adhesive sheet 50 with middle layer 53 formed therein by forming middle layer 53 on the releasable surface of a release liner and transferring it to base 51, then applying adhesive layer 52 formed on another release liner over the surface of middle layer 53 from which the former release liner is removed.

The semiconductor wafer protecting structure of the present invention is constructed by laminating semiconductor wafer W, adhesive sheet 50, fixing jig 60 in this order. Adhesive sheet 50 is adhered to semiconductor wafer W with adhesive layer 52 interposed between the sheet and the circuit surface of semiconductor wafer W. Adhesive sheet 50 and fixing jig 60 are laminated by placing base 51 into close contact with contact layer 62. This protecting structure for semiconductor wafer W is suitable for the surface protection structure in keeping, transferring or processing ultra-thin semiconductor wafer W, for example. In particular, this structure is useful as a semiconductor wafer protecting structure for protecting the circuit surface when the rear side of semiconductor wafer W is ground to a very thin level.

This semiconductor wafer protecting structure can be obtained by adhering adhesive sheet 50 over the circuit surface of semiconductor wafer W first, then applying base 51 of semiconductor wafer W attached with this adhesive sheet to contact layer 62 of fixing jig 60. It is also possible to obtain this structure in the reverse order, by applying contact layer 62 of fixing jig 60 and base 51 of adhesive sheet 50 to each other, then, adhering the circuit surface of semiconductor wafer W over the surface of adhesive layer 52 of this adhesive sheet 50. It is preferred that any application other than the step for adhering adhesive sheet 50 to semiconductor wafer W first, is done in a vacuum so that no air will be trapped at the interface.

The semiconductor wafer grinding method of the present invention is a method of grinding the rear side of semiconductor wafer W up to a predetermined thickness by a wafer grinding machine such as a grinder etc., while protecting semiconductor wafer W using this protecting structure. Specifically, backgrinding is performed by setting the semiconductor wafer protecting structure with its jig base side placed on the processing table of the wafer grinding machine. During this grinding process, jig base 61 is fixed to the processing table by suction. However, this processing table is constructed so as not to be able to suction air from sectioned space 65 via passage hole 66, by clogging the suctioning surface of the processing table that abuts passage hole 66 of jig base 61 or by any other way. In this grinding, it is possible to grind semiconductor wafer W to a thickness of 30 μm to 100 μm, for example.

When semiconductor wafer W is taken out from the processing table after backgrinding of semiconductor wafer W using a usual adhesive sheet, there occur cases where semiconductor wafer W, when it was ground to an extremely thin level, becomes curved because the tensile force acted at the time of adhering remains as residual stress in the adhesive sheet. However, in the semiconductor wafer protecting structure of the present invention, since semiconductor wafer W will not be affected by the internal stress in adhesive sheet 50 because of the rigidity of fixing jig 60, and also, since adhesive sheet 50 excellent in stress relaxation is used, it is possible to reduce the flexion of ultra thinned semiconductor wafer W even after fixing jig 60 is detached.

Next, detachment of fixing jig 60 and peeling of adhesive sheet 50 are done. Specifically, a vacuum device is connected to passage hole 66 of jig base 61, and air is suctioned from sectioned space 65 through passage hole 66, so that contact layer 62 deforms jaggedly, whereby semiconductor wafer W is put in contact with fixing jig 60 via adhesive sheet 50 only at the top of side wall 63 and at the top ends of projections of contact layer 62. As a result, attaching force between semiconductor wafer W attached with adhesive sheet 50 and fixing jig 60 lowers, so that it is possible to easily remove fixing jig 60 from semiconductor wafer W attached with adhesive sheet 50 (step a).

Subsequently, a dicing tape for dividing semiconductor wafer W into chips is adhered on the ground surface of semiconductor wafer W (step b) and adhesive sheet 50 is peeled off from semiconductor wafer W (step c). In peeling adhesive sheet 50, it is preferred that peeling is performed by pulling adhesive sheet 50 at a 180-degree angle using an adhesive tape for removing. Peeling in the direction of 180 degrees will act force only within the plane of semiconductor wafer W, hence reduces the risk of breakage and diminishes residual glue on the circuit surface.

The detachment step of fixing jig 60 (step a), the adhering step of a dicing tape (step b) and the peeling step of adhesive sheet 50 (step c) may be executed in any sequential order, in the order of a>b>c, in the order of a>c>b or in the order of b>a>c. In particular, if dicing tape is pasted so as to fix semiconductor wafer W to the ring frame before detachment of fixing jig 60 (b>a>c), this order is preferred since there is no step in which semiconductor wafer W is handled under condition that semiconductor wafer W is fragile.

Semiconductor wafer W adhered to dicing tape is then processed through a dicing step, a die bonding step and others, so that semiconductor devices are fabricated.

Next, the semiconductor chip fabrication method according to the present invention will be specifically described with reference to the drawings.

<Fixing Jig>

To begin with, for the semiconductor chip fabrication method according to the present invention, the holding jig 20 or fixing jig 60 described above can be used as it is.

<Adhesive Sheet>

Figure 18:
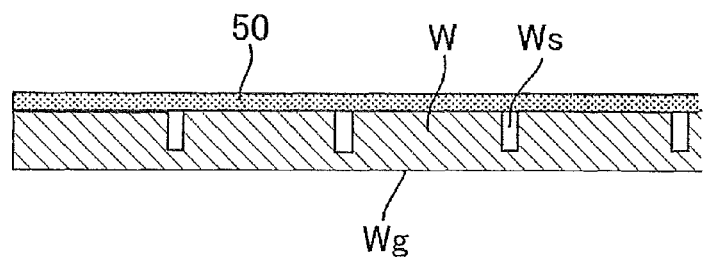
FIG. 18 is a schematic sectional view showing one step of a semiconductor chip fabrication method according to the present invention.

In the present invention, in order to protect the semiconductor wafer circuit surface, an adhesive sheet 50A may be adhered to the circuit surface of semiconductor wafer W as shown in FIG. 18, as required. This adhesive sheet 50A is comprised of a base and an adhesive layer, preferably having a middle layer between the base and adhesive layer.

(Base)

For the base used for adhesive sheet 50A, any resin sheet can be used without particular selection. Examples of the resin sheet include resin films of polyolefins such as low density polyethylene, linear low density polyethylene, polypropylene, polybutene, etc., ethylene copolymers such as ethylene-vinylacetate copolymer, ethylene-(meth)acrylate copolymer, ethylene-(meth)acrylic acid ester copolymer, etc., polyesters such as polyethylene terephthalate, polyethylene naphthalate etc., polyvinyl chloride, acrylic rubber, polyamide, urethane, polyimide and the like. The base may be of a single layer or of a laminated structure. Further, the base may be a sheet that has been done with a cross-linking treatment or the like. Further, the base may be fabricated by forming a film of curable resin and curing the film or by forming a film from a thermoplastic resin.

The thickness of the base is preferably 30 to 1,000 μm, more preferably 50 to 800 μm, and particularly preferably 80 to 500 μm. Further, at least the side of the base that is in contact with contact layer 62 of fixing jig 60 preferably has a surface energy of 20 to 60 mN/m, and more preferably 25 to 50 mN/m. The surface energy falling within the above range optimizes its attaching force to contact layer 62, neither blocking nor dislodging of the wafer due to insufficient attaching force will occur.

The surface roughness (arithmetic mean roughness Ra) of the base is preferably 1.0 μm or lower, and more preferably 0.2 μm or lower. The arithmetic mean roughness Ra falling within the above range provides stable adhesion since there is no cause of lowering the adhesion between contact layer 62 and adhesive sheet 50A.

The base is not particularly limited as long as it is a resin film having the physical properties as above, and the resin itself may satisfy the above physical properties or the resin film may be added with other additives or may be subjected to surface treatments so as to present the above physical properties. Further, in the above resin, inorganic fillers such as calcium carbonate, silica, mica etc., metal fillers such as iron, lead, etc., coloring agents such as pigments, dies etc., may be added as additives.

The base can be fabricated by casting a resin in a fluid form (resin before curing, resin solution or the like) over a casting sheet, forming a thin layer, then processing it to be a film by a predetermined means. This production method lowers stress acting on the resin and reduces generation of fish-eyes during film-forming. Further, it also presents high uniformity of film thickness so that the thickness precision usually falls within 2%. As the other film forming methods, methods of producing the base as a single layer film by T-die or inflation extruding or by calendering can be listed.

(Adhesive Layer)

The adhesive layer can be formed from various kinds of conventionally known pressure sensitive adhesives. Though there is no limitation on these adhesives, adhesives of a rubber type, acrylic type, silicone type, polyvinyl ether etc. can also be used, for example. Energy ray-curable type adhesives, heat-foaming type adhesives, and water swelling type adhesives can be used. In the present invention, energy ray-curable type adhesives, in particular, UV curable type adhesives are preferably used.

An typical energy ray-curing type adhesive is essentially formed of an acrylic adhesive and an energy ray polymerizable compound. As the energy ray polymerizable compounds used for an energy ray-curing type adhesive, low-molecular weight compounds having at least two photo-polymerizing carbon-carbon double bonds in the molecule that can form three-dimensional networks by irradiation of light are widely used. Specifically, trimethylolpropane triacrylate, pentaerythritol triacrylate, pentaerythritol tetraacrylate, dipentaerythritol monohydroxy pentaacrylate, dipentaerythritol hexaacrylate, or 1,4-butyleneglycol diacrylate, 1,6-hexanediol diacrylate, polyethyleneglycol diacrylate, oligoester acrylate, urethane acrylate and the like are used.

As to the compounded ratio between the acrylic adhesive and the energy ray-polymerizing compound in the energy ray-curing type adhesive, 10 to 1,000 parts by weight, preferably 20 to 500 parts by weight or particularly preferably, 50 to 200 parts by weight of the energy ray-polymerizing compound is used for 100 parts by weight of the acrylic adhesive. In this case, the resultant adhesive sheet 50A presents a strong adhesive force at the initial and a markedly lowered adhesive force after irradiation of energy rays. As a result, it is easy to perform peeling at the interface between the semiconductor chip and the energy ray-curing type adhesive layer after completion of backgrinding.

Further, the energy ray-curable type adhesive may be formed of an energy ray-curable type copolymer having energy ray-polymerizable groups as its side chains. Energy ray-curing type copolymers of this kind have both adhesive and energy ray-curable properties.

It is possible to shorten the polymerization curing time by photo irradiation and the amount of photo irradiation by blending a photo polymerization initiator into the energy ray-curing type adhesive. Examples of such photo polymerization initiators include: photo initiators such as benzoin compounds, acetophenone compounds, acylphosphine oxide compounds, titanocene compounds, tioxanthone compounds, peroxide compounds, etc.; and photosensitizers such as amine, quinone, etc. Specifically, 1-hydroxy cyclohexyl phenylketone, benzoin, benzoin methylether, benzoin ethylether, benzoin isopropylether, benzyl diphenyl sulfide, tetramethyl thiuram monosulfide, azobisisobutyronitril, dibenzyl, diacetyl, B-chloroanthraquinone, etc. can be listed.

The use amount of the photo polymerization initiator is preferably 0.05 to 15 parts by weight, more preferably 0.1 to 10 parts by weights, particularly preferably 0.5 to 5 parts by weight, relative to 100 parts by weight of the total adhesive.

In order to partially cross-link the polymer component in the above adhesive, a cross-linker may be used. As this cross-linker, epoxy type cross-linker, isocyanate type cross-linker, methylol type cross-linker, chelate type cross-linker, aziridine type cross-linker and the like are used for example.

The acrylic energy ray-curable type adhesive as above provides an adequate adhesion to semiconductor wafer W before irradiation of energy rays and markedly lowered adhesion after irradiation of energy rays. That is, this makes it possible to closely attach adhesive sheet 50A and semiconductor wafer W with a strong enough adhesion before irradiation of energy rays to protect the surface and enables easy release of the adhesive sheet from the ground semiconductor chips after irradiation of energy rays.

The thickness of the adhesive layer is usually about 3 to 100 μm, preferably about 10 to 50 μm, though it depends on the material.

(Middle Layer)

When large undulating bumps are formed on the circuit surface of semiconductor wafer W, a middle layer may be provided in adhesive sheet 50A between the base and the adhesive layer in order for the adhesive layer to follow the undulating surface of the bumps. The material for the middle layer is not particularly limited as long as it satisfies the aforementioned physical properties. For example, various adhesive compositions of acrylic type, rubber type, silicone type, UV curing type resins, thermoplastic elastomers etc., can be used.

The total thickness of the middle layer and adhesive layer is determined as appropriate, taking into account the height of bumps on the object to which adhesive sheet 50A is pasted, the bump configuration, the pitch between bumps etc. Typically, the total thickness of the middle layer and the adhesive layer is specified to be equal to or greater than 50% and preferably 100 to 200% of the bump height. Specifying the total thickness of the middle layer and the adhesive layer as above enables adhesive sheet 50A to follow the bumpiness on the circuit surface and thereby eliminate the undulation. Accordingly, the thickness of the middle layer is also specified to fall within the range of 5 to 500 μm for example, depending on the undulating height of the circuit surface.

(Fabrication Method of the Adhesive Sheet)

Adhesive sheet 50A can be obtained by forming an adhesive layer by applying and drying the aforementioned adhesive of an appropriate thickness over the base in a generally known method such as using a knife coater, roll coater, gravure coater, die coater, reverse coater, etc., and then laminating a release liner over the adhesive layer as required. On the contrary, it is also possible to obtain adhesive sheet 50A by forming an adhesive layer over the release treatment surface of the release liner and then laminating it to the base.

When a middle layer is provided, the resin for forming the middle layer is applied and then is dried or cured by the necessary means to form the middle layer. Then an adhesive layer is formed over this middle layer by the aforementioned method to thereby provide a middle layer-equipped adhesive sheet 50A. It is also possible to produce a middle layer-equipped adhesive sheet 50A by forming a middle layer on the peel-off surface of a separation sheet and transferring it to the base, then adhering an adhesive layer formed on another release liner over the surface of the middle layer from which the former release liner is removed.

<Transfer Tape>

In order to pick up semiconductor chips Wc divided on fixing jig 60 or adhesive sheet 50A, semiconductor chips Wc are transferred to transfer tape 80. This transfer tape 80 is comprised of a base and an adhesive layer similarly to adhesive sheet 50A, and preferably employs a removable type adhesive sheet presenting a peeling force of extent that can pick up the transferred chips Wc, or an energy ray-curable type adhesive sheet that can decrease or loss its adhesion by irradiation of energy rays. As this transfer tape 80, an equivalent of the so-called dicing sheet on the market can also be used.

<Fabrication Process of Semiconductor Chips>

Figure 12:
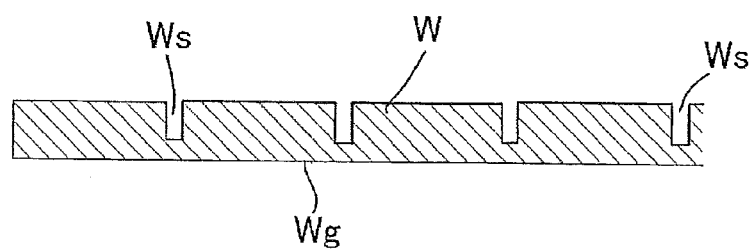
FIG. 12 is a schematic sectional view showing one step of a semiconductor chip fabrication method according to the present invention.

In the semiconductor chip fabrication method according to the present invention, grooves Ws shallower than the thickness of semiconductor wafer W are cut out along the circuits on the circuit surface side of semiconductor wafer W with a plurality of circuits formed thereon (FIG. 12). Grooves Ws are formed so as to section the multiple circuits formed on the semiconductor wafer W surface. The depth of groove Ws is not particularly limited as long as it is slightly deeper than the thickness of the chip to be formed. Formation of grooves Ws is done by dicing blades or the like of a dicing machine.

Figure 13:
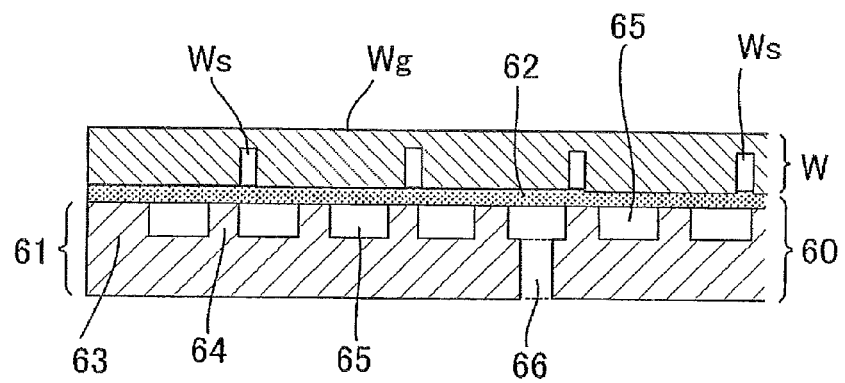
FIG. 13 is a schematic sectional view showing one step of a semiconductor chip fabrication method according to the present invention.
Figure 14:
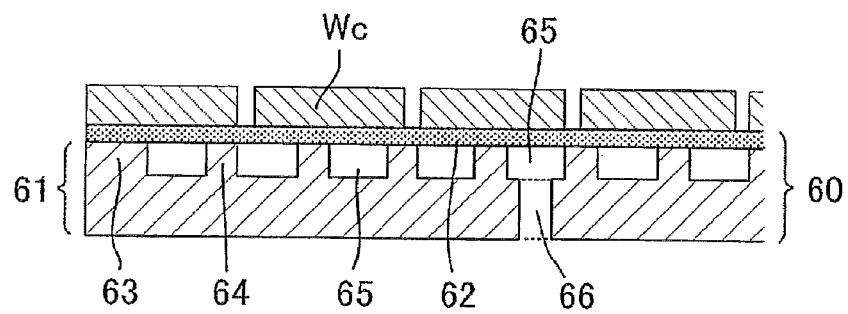
FIG. 14 is a schematic sectional view showing one step of a semiconductor chip fabrication method according to the present invention.

Next, fixing jig 60 is attached to the surface on which grooves Ws were formed so that this surface is put in abutment with contact layer 62 (FIG. 13). Thereafter, the rear side (ground surface) Wg of semiconductor wafer W is ground using the grinder so as to reduce the thickness of semiconductor wafer W and finally divide it into individual semiconductor chips Wc. That is, backgrinding is performed until the bottom of grooves Ws is removed, to thereby divide semiconductor wafer W into chips of individual circuits (FIG. 14). Backgrinding may be further performed if necessary, so as to provide multiple semiconductor chips (which will be also called "a group of chips" hereinbelow) Wc having a predetermined thickness.

Jig base 61 is fixed to the processing table by suction during this grinding work. This processing table is constructed so as not to be able to suction air from sectioned space 65 via passage hole 66, by clogging the suctioning surface of the processing table that abuts passage hole 66 of jig base 61. Since fixing jig 60 forms an extremely rigid support, it is possible to grind semiconductor wafer W to as thin as, for example, 100 μm or less, particularly 50 μm or less.

Figure 15:
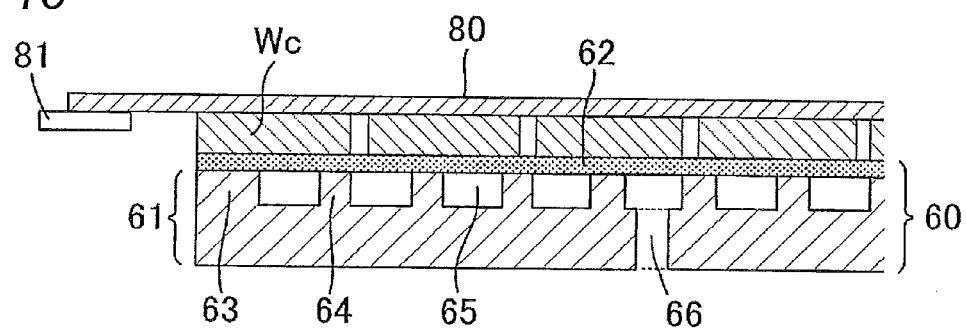
FIG. 15 is a schematic sectional view showing one step of a semiconductor chip fabrication method according to the present invention.

Though the pickup method of the resultant group of chips is not particularly limited, the following method, for example can be preferably used. While keeping the divided individual semiconductor chips Wc in alignment, transfer tape 80 for pick-up is adhered to the ground side (rear side) of the chips (FIG. 15). Transfer tape 80 is greater in area than the group of chips and is fixed along its periphery by a frame 81.

Figure 16:
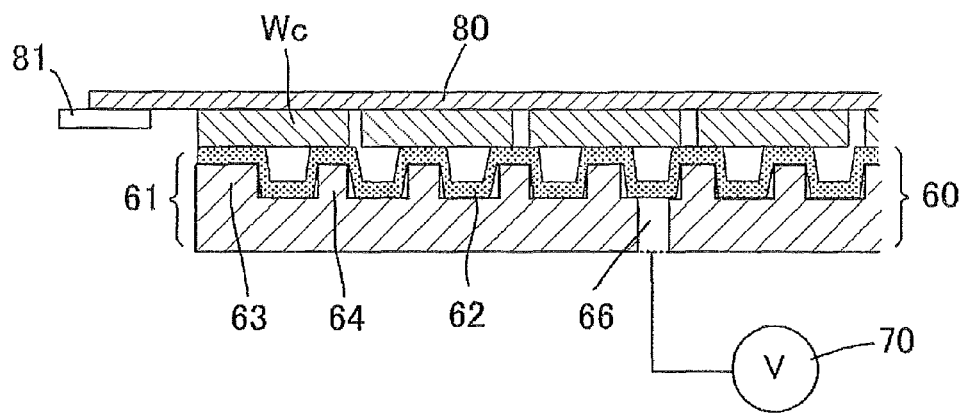
FIG. 16 is a schematic sectional view showing one step of a semiconductor chip fabrication method according to the present invention.
Figure 17:
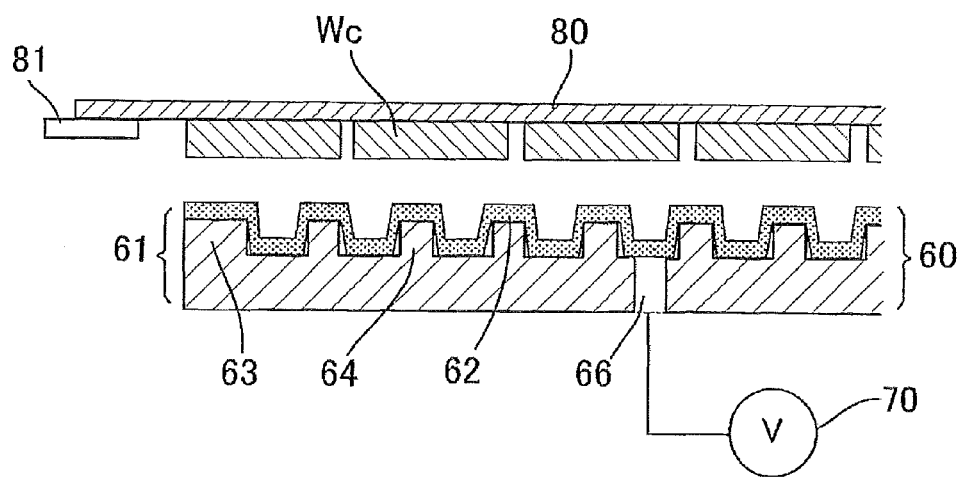
FIG. 17 is a schematic sectional view showing one step of a semiconductor chip fabrication method according to the present invention.

Subsequently, air inside sectioned space 65 is suctioned via passage hole 66 of fixing jig 60 by vacuum device 70 to deform contact layer 62 jaggedly, so that semiconductor chips Wc are put in contact with fixing jig 60 at the top of side wall 63 and the top ends of projected portions of contact layer 62 only (FIG. 16). Thereby, adhesion between semiconductor chips Wc and fixing jig 60 lowers so that the semiconductor chips Wc can be easily removed from fixing jig 60 and transferred to transfer tape 80 (FIG. 17).

The semiconductor chips Wc thus transferred to transfer tape 80 are picked up from transfer tape 80 by a conventionally known method and fabricated into semiconductor devices through the ordinary process. When transfer tape 80 is formed using an energy ray-curable type adhesive, the adhesive force of transfer tape 80 can be lowered by irradiating the transfer tape 80 from its base side with energy rays, so that it is possible to easily pick up semiconductor chips Wc from transfer tape 80.

Figure 19:
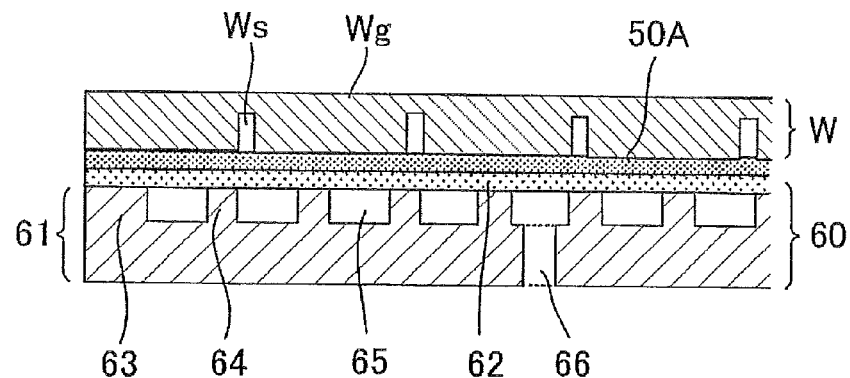
FIG. 19 is a schematic sectional view showing one step of a semiconductor chip fabrication method according to the present invention.
Figure 20:
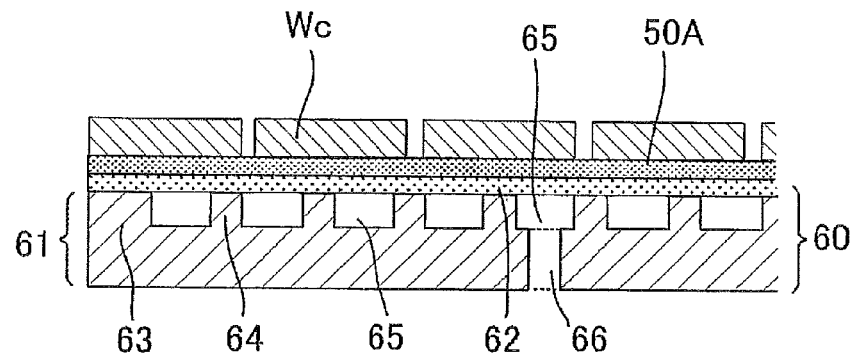
FIG. 20 is a schematic sectional view showing one step of a semiconductor chip fabrication method according to the present invention.
Figure 21:
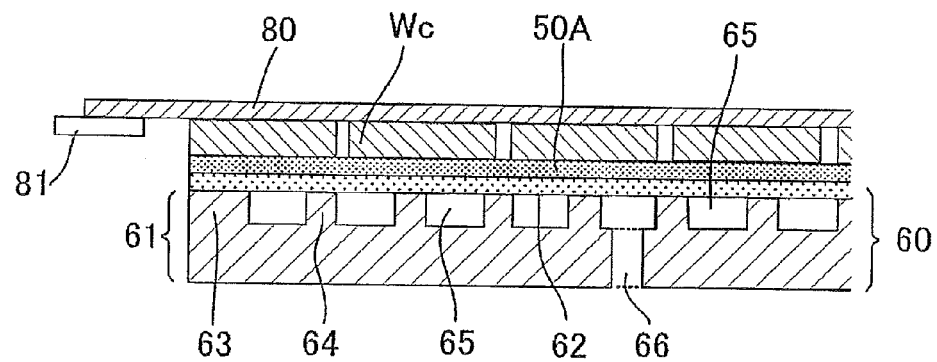
FIG. 21 is a schematic sectional view showing one step of a semiconductor chip fabrication method according to the present invention.
Figure 22:
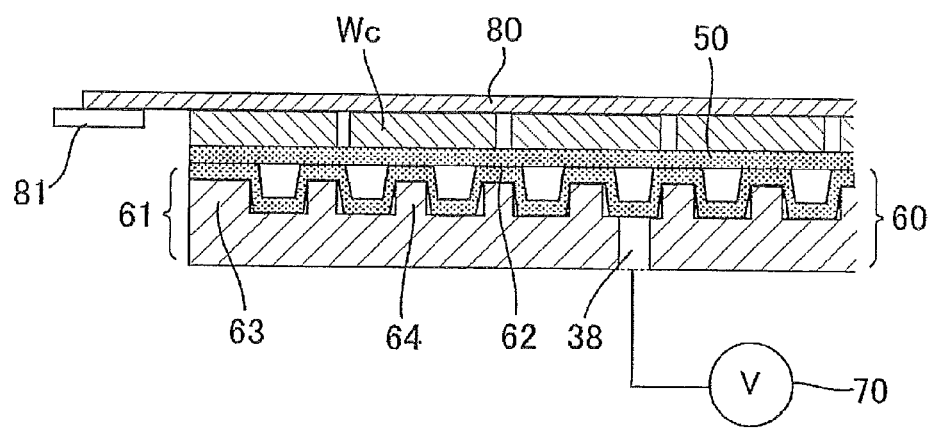
FIG. 22 is a schematic sectional view showing one step of a semiconductor chip fabrication method according to the present invention.
Figure 23:
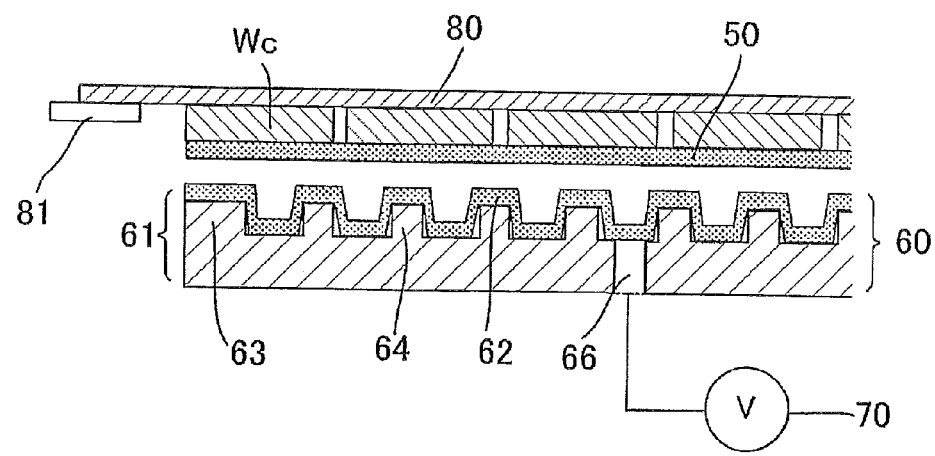
FIG. 23 is a schematic sectional view showing one step of a semiconductor chip fabrication method according to the present invention.

Further, when the undulation on the circuit surface is so large that contact layer 62 cannot fix semiconductor wafer W fast, adhesive sheet 50A is attached to the circuit surface with grooves Ws formed thereon (FIG. 18), and fixing jig 60 is adhered to the base surface of the adhesive sheet 50A (FIG. 19). When the circuit surface has further greater unevenness formed by electrodes and other bumps, adhesive sheet 50A formed with a middle layer is used.

Thereafter, wafer W fixed to fixing jig 60 via adhesive sheet 50A is also ground on its rear side in the same manner as above, and the group of individually divided chips is transferred to transfer tape 80 (FIGS. 20 to 23). Then, adhesive sheet 50A is removed from semiconductor chips Wc. When the adhesive layer is formed of an energy ray-curing type adhesive, the adhesive force of the adhesive layer can be lowered by irradiating the adhesive sheet 50A from its base side with energy rays, so that it is possible to easily peel off adhesive sheet 50A from semiconductor chips Wc.

Also, instead of the above process, the steps may be done in the order of detaching fixing jig 60 from the base surface of adhesive sheet 50A before adhering transfer tape 80 to the group of chips, transferring the group of chips to transfer tape 80 and then removing adhesive sheet 50A.

EXAMPLES

Now, examples will be described when a 300 mm type semiconductor wafer is processed through backgrinding using the holding jigs of the present invention in a semiconductor wafer backgrinding machine.

To begin with, the holding jigs shown in FIG. 3 or 4 were prepared as examples 1 to 17, by differentiating the configurations as shown in Table 1. These holding jigs were evaluated as to evaluation items, that is, repetition durability, time for detachment, penetration of abrasive fluid, wafer holding strength, wafer thickness and wafer thickness variance, by putting each holding jig on the chuck table in the semiconductor wafer backgrinding machine so that a 300 mm type semiconductor wafer was processed by backgrinding.

TABLE 1

|  |  |  | Example 1 | Example 2 | Example 3 | Example 4 | Example 5 | Example 6 | Example 7 | Example 8 | Example 9 |
| --- | --- | --- | --- | --- | --- | --- | --- | --- | --- | --- | --- |
| Base plate | Material |  | PC | PC | PC | PC | PC | PC | PC | PC | PC |
|  | Projection pitch | (mm) | 1 | 0.3 | 0.15 | 0.1 | 1 | 2 | 2.5 | 1 | 1 |
|  | Projection shape |  | Cylinder | Cylinder | Cylinder | Cylinder | Cylinder | Cylinder | Cylinder | Cylinder | Cylinder |
|  | Projection width | (mm) | 0.4 | 0.1 | 0.05 | 0.04 | 0.05 | 0.8 | 1.2 | 0.4 | 0.4 |
|  | Projection height | (mm) | 0.2 | 0.1 | 0.07 | 0.04 | 0.05 | 0.4 | 0.6 | 0.2 | 0.2 |
|  | Total thickness | (mm) | 1 | 1 | 1 | 1 | 1 | 1 | 1.2 | 1 | 1 |
| Contact film | Material |  | WH302 | WH302 | WH302 | WH302 | WH302 | WH302 | WH302 | WH302 | WH302 |
|  | Thickness | (μm) | 50 | 50 | 50 | 20 | 20 | 50 | 50 | 20 | 15 |
|  | Strength at break | (MPa) | 10 | 10 | 10 | 10 | 10 | 10 | 10 | 10 | 10 |
|  | Elongation at break | (%) | 640 | 640 | 640 | 640 | 640 | 640 | 640 | 640 | 640 |
|  | Bending elasticity | (MPa) | 59 | 59 | 59 | 59 | 59 | 59 | 59 | 59 | 59 |
|  | Shear strength | (N) | 35< | 35< | 35< | 35< | 35< | 35< | 35< | 35< | 35< |
|  | Attaching force | (N/25 mm) | 0.004 | 0.004 | 0.004 | 0.004 | 0.004 | 0.004 | 0.004 | 0.004 | 0.004 |
| Evaluation | Repetition durability | Count | 100 | 100 | 100 | 100 | 100 | 100 | 84 | 100 | 66 |
|  | Time for detachment | (Seconds) | 2 | 4 | 7 | 11 | 24 | <1 | <1 | <1 | <1 |
|  | Penetration of abrasive fluid | (mm) | 1 | 1 | 1 | 2 | 2 | 1 | 1 | 2 | 4 |
|  | Wafer holding strength | (MPa) | 0.2 | 0.2 | 0.2 | 0.1 | 0.1 | 0.2 | 0.2 | 0.2 | 0.1 |
|  | Wafer thickness | (μm) | 79 | 78 | 76 | 76 | 77 | 82 | 91 | 78 | 78 |

TABLE 1-continued

| | | | | | | | | | | |
|---|---|---|---|---|---|---|---|---|---|---|
| Wafer thickness variance | (μm) | | 8 | 7 | 5 | 4 | 9 | 8 | 11 | 8 | 8 |

| | | | Example 10 | Example 11 | Example 12 | Example 13 | Example 14 | Example 15 | Example 16 | Example 17 |
|---|---|---|---|---|---|---|---|---|---|---|
| Base plate | Material | | PC | PC | PC | PC | PC | PC | PC | PC |
| | Projection pitch | (mm) | 1 | 1 | 1 | 1 | 1 | 1 | 1 | 1 |
| | Projection shape | | Cylinder | Cylinder | Cylinder | Cylinder | Cylinder | Cylinder | Cylinder | Cylinder |
| | Projection width | (mm) | 0.4 | 0.4 | 0.4 | 0.4 | 0.4 | 0.4 | 0.4 | 0.4 |
| | Projection height | (mm) | 0.2 | 0.2 | 0.2 | 0.2 | 0.2 | 0.2 | 0.2 | 0.2 |
| | Total thickness | (mm) | 1 | 1 | 1 | 1 | 1 | 1 | 1 | 1 |
| Contact film | Material | | WH302 | WH302 | KE941-U | KE742-U | T3712 | KE1950-20 | FS370 | PLATILON U01 |
| | Thickness | (μm) | 200 | 250 | 50 | 50 | 50 | 50 | 50 | 50 |
| | Strength at break | (MPa) | 10 | 10 | 6 | 4 | 2 | 6 | 22 | 95 |
| | Elongation at break | (%) | 640 | 640 | 365 | 300 | 2700 | 900 | 520 | 560 |
| | Bending elasticity | (MPa) | 59 | 59 | 55 | 56 | 15 | 8 | 250 | 400 |
| | Shear strength | (N) | 35< | 35< | 35< | 35< | 35< | 35< | 23 | 7 |
| | Attaching force | (N/25 mm) | 0.004 | 0.004 | 0.006 | 0.006 | 0.2 | 0.02 | 0.001 | 0.001 |
| Evaluation | Repetition durability | Count | 100 | 100 | 58 | 32 | 45 | 100 | 100 | 100 |
| | Time for detachment | (Seconds) | 34 | 68 | 2 | 2 | 8 | 72 | 2 | 1 |
| | Penetration of abrasive fluid | (mm) | <1 | <1 | 1 | 1 | <1 | <1 | 5 | 35 |
| | Wafer holding strength | (MPa) | 0.3 | 0.3 | 0.2 | 0.2 | 0.8 | 0.6 | 0.1 | 0.05 |
| | Wafer thickness | (μm) | 83 | 86 | 78 | 78 | 79 | 78 | 77 | 77 |
| | Wafer thickness variance | (μm) | 8 | 9 | 8 | 8 | 7 | 7 | 7 | 8 |

The tensile strength at break, elongation at break, bending elasticity, shear strength and attaching force of the contact films shown in Table 1 were determined based on the methods described in the embodiment. The materials for base plates and contact films shown in Table 1 are as follows.

Iupilon (registered trade name) E-2000R [bending elasticity=2.3 GPa (measured by ISO 178)]: Polycarbonate (abbreviated as PC in Table 1) (manufactured by Mitsubishi Engineering-Plastics Corporation)

WH302: Ethylene methyl methacrylate copolymer (manufactured by SUMITOMO CHEMICAL Co., Ltd.)

KE941-U: Silicone rubber (manufactured by Shin-Etsu Chemical Co., Ltd.)

KE742-U: Silicone rubber (manufactured by Shin-Etsu Chemical Co., Ltd.)

T3712: Propylene-olefin copolymer (manufactured by SUMITOMO CHEMICAL Co., Ltd.)

KE1950-20: Silicone rubber (manufactured by Shin-Etsu Chemical Co., Ltd.)

FS370: Linear low density polyethylene (manufactured by SUMITOMO CHEMICAL Co., Ltd.)

PLATILON U01: Urethane elastomer (manufactured by Bayer)

Evaluation Method

Repetition durability: with n=5, a 300 mm type semiconductor wafer of 775 μm thick was ground to the set value or 75 μm, and the minimum count when breakage occurred first was shown. If no breakage occurred, 100 times of grinding were repeated.

Time for detachment: the time required for the semiconductor wafer to become detachable by deforming the contact film of the holding jig by actuating a vacuum pump was shown.

Penetration of abrasive fluid: the maximum distance of penetration determined from the penetration trance of abrasion fluid in the holding jig after grinding was shown.

Wafer holding strength: in the state where the semiconductor wafer was closely held by the contact film of the holding jig and fixed from both sides by vacuum chuck, the strength when pulled in the peeling direction was shown.

Figure 24:
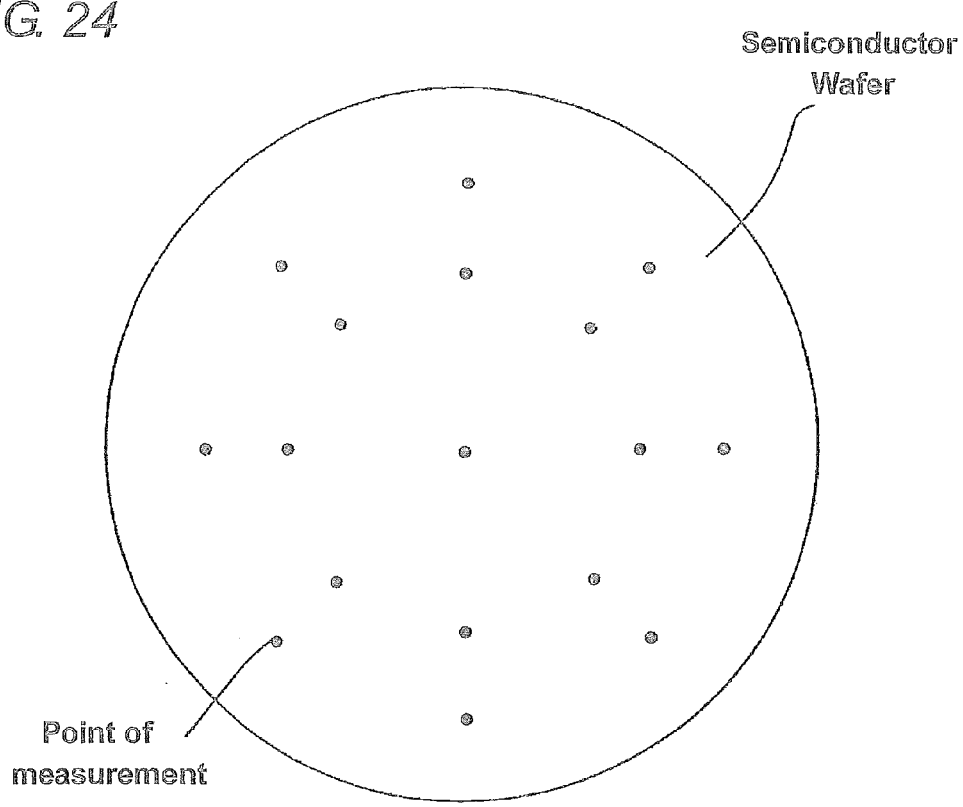
FIG. 24 is a top illustrative view showing points of measurement of wafer thickness and variation in an embodied example of a holding device according to the present invention.
Figure 25:
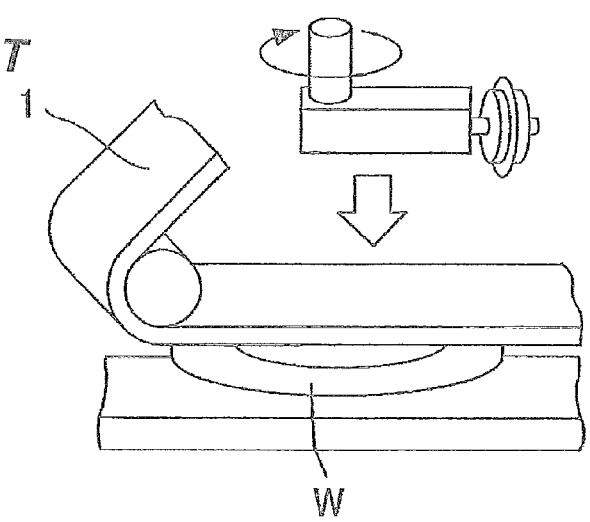
FIG. 25 is a perspective illustrative view showing a situation in which a protection sheet is stuck to the pattern forming surface of a semiconductor wafer.
Figure 26:
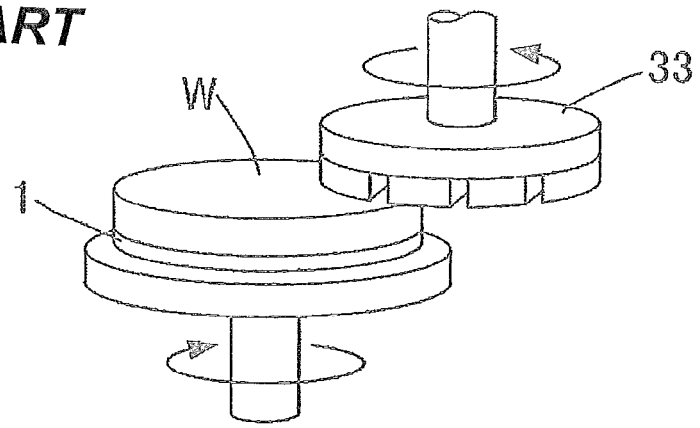
FIG. 26 is a perspective illustrative view showing a situation in which the rear side of a semiconductor wafer undergoes backgrinding with a rotary grinder.
Figure 27:
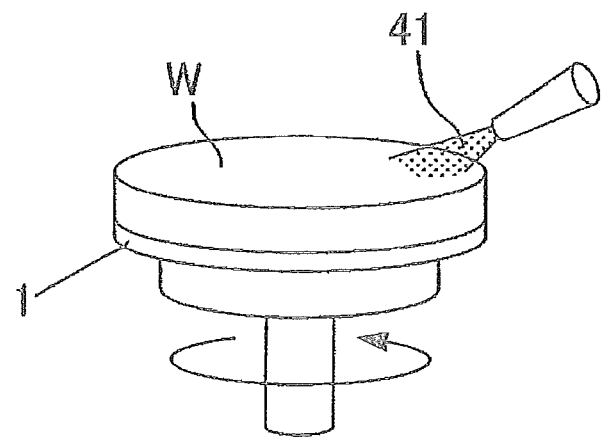
FIG. 27 is a perspective illustrative view showing a situation in which the damaged rear side of a semiconductor wafer is etched by chemicals.
Figure 28:
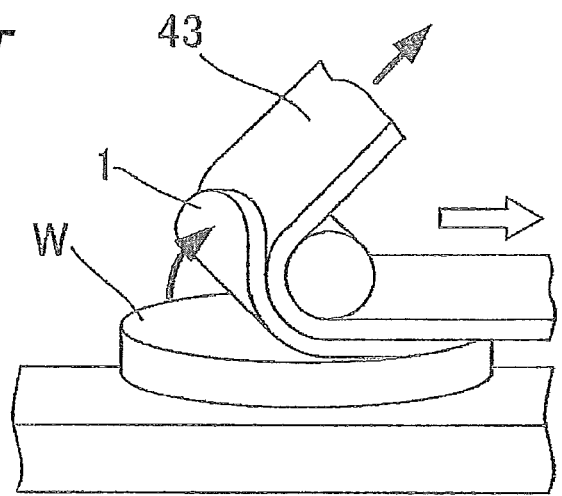
FIG. 28 is a perspective illustrative view showing a situation in which a protection sheet is peeled off from the pattern forming surface of a semiconductor wafer.

Wafer thickness: the thickness of the semiconductor wafer after grinding was measured at 17 points as shown in FIG. 24, and the mean value was shown.

Wafer thickness variance: the thickness of the semiconductor wafer after grinding was measured at 17 points as shown in FIG. 24, and the greatest value of the maximum minus the minimum was shown.

Evaluation Result

In the case of example 1, the supporting projection pitch, supporting projection width, supporting projection height, contact film thickness, strength at break, elongation at break, bending elasticity, shear adhesion, adhesion are all specified to fall within the preferable ranges, and the result was excellent in repetition durability. Further, the time required to detach the semiconductor wafer was remarkably short; penetration of abrasive fluid was at a level that would not cause trouble; the wafer holding strength was adequately strong; the wafer thickness fell within the adjustable range; and the wafer thickness variance could be made small enough.

In the case of example 2, in comparison with example 1, since the supporting projection pitch was reduced within the preferable range while the supporting projection width, the supporting projection height were specified to be smaller within the preferable range, the time for detachment became slightly longer. However, the time is still within the range that is suitable for practical use. The thickness variance presented a better result than that of example 1, though the difference was very slim.

In the case of example 3, since the supporting projection pitch was specified to be smaller, deviating from the preferable range while the supporting projection width and the supporting projection height were specified to be smaller within the preferable range, the time for detachment results in 7 seconds. However, it was confirmed that the wafer thickness variance tended toward improvement.

In the case of example 4, since the supporting projection pitch, the supporting projection width and the supporting projection height were specified to be smaller, deviating from the preferable range while the contact film thickness was specified within the preferable range, the time for detachment results in 11 seconds, and penetration of abrasive fluid became greater, resulting in 2 mm. However, it was confirmed that the wafer thickness variance tended toward further improvement.

In the case of example 5, the supporting projection pitch was reset to 1 mm while the supporting projection width, the supporting projection height and the contact film thickness were made smaller within the preferable range. Comparing with example 1, the time for detachment became longer and the extent of penetration of abrasive fluid became greater, but the result was still suitable for practical use.

In the case of example 6, in comparison with example 1, the supporting projection pitch, the supporting projection width and the supporting projection height were changed to be greater within the preferable range. As a result, the time required for detachment was markedly improved. Though the wafer thickness became greater, it still fell within the adjustable range.

In the case of example 7, the supporting projection pitch, the supporting projection width and the supporting projection height were made greater, deviating from the preferable range. As a result, the time for detachment was equal to or shorter than 1 seconds, which was markedly excellent. However, as to the repetition durability, damage was recognized at 84 times of usage for the sample that was least durable. Further, though the wafer thickness fell within the adjustable range, the thickness tended to be greater and the thickness variance resulted in 11 µm.

In the case of example 8, in comparison with example 1, only the contact film thickness was made smaller within the preferable range. As a result the time for detachment was markedly improved. Penetration of abrasive fluid resulted in 2 mm, which was the level that would not cause trouble.

In the case of example 9, in comparison with example 1, only the contact film thickness was made smaller, deviating from the preferable range. As a result the time for detachment was fair, but as to the repetition durability, damage was recognized at 66 times of usage for the sample that was least durable. Further, penetration of abrasive fluid resulted in 4 mm and it was found that washing is needed if there are chips formed in this area.

In the case of example 10, in comparison with example 1, the contact film thickness was made greater within the preferable range. As a result the time for detachment became longer, resulting in 34 seconds. However, penetration of abrasive fluid became fair, resulting in being less than 1 mm, and good result could be obtained for other characteristics.

In the case of example 11, the contact film was made further thicker than that of example 10, deviating from the preferable range. As a result, though penetration of abrasive fluid became fair, resulting in being less than 1 mm, the time required for detachment resulted in 68 seconds.

In the case of example 12, the material of the contact film was changed. As a result, the strength at break became lower within the preferable range, and the elongation at break became smaller, deviating from the preferable range. In comparison with example 1, only the repetition durability showed an inferior result as low as 58 times.

In the case of example 13, the material of the contact film was changed and the strength at break and elongation at break were reduced, deviating from the preferable range. As a result, the repetition durability showed a result inferior to example 12, being as low as 32 times.

In the case of example 14, the material of the contact film was changed. As a result, the strength at break was lowered deviating from the preferable range and the bending elasticity became smaller within the preferable range, whereas the elongation at break was improved within the preferable range. In comparison with example 1, the repetition durability showed an inferior result as low as 45 times, but penetration of abrasive fluid was less than 1 mm, showing an excellent result.

In the case of example 15, the contact film material was changed, so that the bending elasticity was lowered deviating from the preferable range while the elongation at break was improved to 900%. As a result, the time required for detachment results in 72 seconds though penetration of abrasive fluid showed an excellent result, being less than 1 mm.

In the case of example 16, the material of the contact film was changed so that the bending elasticity became greater exceeding the preferable range. As a result, the extent of penetration of abrasive fluid became greater, resulting in being 5 mm, which needed washing of the wafer.

In the case of example 17, the material of the contact film was changed so that the bending elasticity became greater exceeding the preferable range and the shear strength became smaller deviating from the preferable range. As a result, penetration of abrasive fluid resulted in 35 mm, which made it inevitable to wash the wafer.

Next, examples of the semiconductor wafer protecting structure according to the present invention will be described. The present invention should not be limited to the examples. The examples were evaluated based on the following methods.

(Bending elasticity): the bending elasticity of the jig base was measured by the bending test method (three point bending test method) defined in JIS K6911. The bending elasticity of the contact layer was measured based on ASTM D747-70.

(Tensile strength at break) was measured conforming to JIS K7127, using a test piece type 2 at a drawing speed of 200 mm/min.

(Tensile stress at break) was measured conforming to JIS K7127, using a test piece type 2 at a drawing speed of 200 mm/min.

(Shear strength) was measured as a load when a well-known glass plate having a size of 30 mm long, 30 mm wide and 3 mm thick, to which the contact layer was adhered, being placed on the mirror wafer consisting of silicon under application of a load of 900 g over the whole of the glass plate and contact layer for five seconds, was pushed in a direction parallel to the mirror wafer and the glass plate began moving. When it did not begin moving with a load of 35 N, the result was evaluated as "being greater than 35N" and no further measurement was done.

(Attaching force): the adhesion was evaluated as the peeling strength that was obtained by placing the simplex film of the contact layer, cut in a width of 30 mm, over the mirror surface of the wafer using a rubber roller, leaving it for 20 minutes, then peeling the film at a 180-degree angle and speed of 300 mm/min.

(Surface roughness) was measured as the arithmetic mean roughness Ra by a surface roughness detector (product name: SURFPACK SV-3000 manufactured by Mitsutoyo Corporation) based on JIS B0601-2001.

(Surface energy): the surface energy was measured as a value that was obtained by analysis of the contact angles obtained using water, diiodomethane and α-bromonaphthalene as test solutions, using a geometric mean approach based on the extended Fowkes equation.

(Stress relaxation ratio): An adhesive sheet sample of 100 mm long is pulled at a speed of 200 mm/min and the pulling is stopped when it is extended by 10%. The stress relaxation ratio is defined as a value calculated by (A−B)/A×100(%) where A is the stress at the time of 10% extension and B is the stress 1 minute after stoppage of extension.

(tan δ): tan δ was measured under tensile stress at 110 Hz by a dynamic viscoelastometer. Specifically, tan δ was measured in the range of −40 deg. C. to 150 deg. C. at a frequency of 110 Hz using Rheovibron DDV-II-EP manufactured by Orientec Co., Ltd., and the maximum value in the range of −5 deg. C. to 80 deg. C. was adopted as the "tan δ value".

(Elasticity): Elasticity G' of the adhesive and middle layer at 23 deg. C. was measured by a twisting and shearing method at 110 Hz, using a dynamic viscoelastometer (RDAII from Rheometrics Inc.).

Example 18

(Fixing Jig Fabrication)

A polycarbonate sheet of 0.7 mm thick (having a bending elasticity of 2.3 GPa) was cut into a circular shape having a diameter of 202 mm and was formed by a heat pressing process so that projections having a height of 0.1 mm and a diameter of 0.2 mm were arranged at a pitch of 1.0 mm on one side of the sheet and a side wall of 1.0 mm wide and 0.1 mm high was formed at the periphery. Further, a passage hole having a diameter of 1 mm was formed at a position 1 cm inward from the side wall where no projection was formed, by a drilling machine to complete a jig base.

A film, consisting of ethylene methyl methacrylate resin (a product name: Acryft WH303, manufactured by SUMITOMO CHEMICAL Co., Ltd.), having a thickness of 100 μm, a tensile strength at break of 9 MPa, an elongation at break of 750%, a bending elasticity of 27 MPa, a shear adhesive of greater than 35 N and an attaching force of less than 0.1N/25 mm (less than the lower limit of measurement) was bonded as a contact layer over the top surface of the side wall and the top ends of projections of the jig base using a modified silicone adhesive to complete a fixing jig having a diameter of 202 mm.

(Adhesive Sheet Fabrication)

50 parts by weight of urethane acrylate oligomer (a product of Arakawa Chemical Industries, Ltd.) having a weight average molecule weight of 5,000, 25 parts by weight of isobornyl acrylate, 25 parts by weight of phenylhydroxy propyl acrylate, 2.0 parts by weight of 1-hydroxy cyclohexyl phenyl ketone (IRGACURE 184 by Ciba-Geigy K.K) as a photo polymerization initiator and 0.2 part by weight of phthalocyanine pigment were blended to obtain an energy ray-curable type resin composition.

The obtained resin composition was applied by a fountain-die process over a polyethylene terephthalate film (which will be referred to hereinbelow as "PET film" of 38 μm thick: a product of Toray Industries, Inc.) as a casting sheet to form a resin composition layer of 110 μm thick. Immediately after application, the same PET film was additionally laminated over the resin composition layer, then the lamination was irradiated with UV rays with a light intensity of 250 mJ/cm$^2$, using a high pressure mercury lamp (160 W/cm from 10 cm high) so as to cross-link and cure the resin composition layer. The PET films on both sides were peeled off to obtain a base of 110 μm thick. This base had a surface energy of 34 mN/m and an arithmetic mean roughness Ra of 0.098 μm with the maximum tan δ value of 1.20.

An adhesive composition, a blend of 100 parts by weight of an acryl adhesive (product name: SK Dyne 909A-6 from Soken Chemical & Engineering Co., Ltd.), 66 parts by weight of urethane acrylate oligomer (product name: EXL800 (weight average molecular weight: about 6,000) from Dainichiseika Color & Chemicals MFg. Co., Ltd.), 10 parts by weight of an isocyanate cross-linker (product name: BHS-8515, from TOYO INKMFG. CO., LTD.), 0.05 part by weight of an epoxy cross-linker (product name: TC-X from Mitsubishi Gas chemical company, INC.) and 3 parts by weight of a photo polymerization initiator (IRGACURE 184 by Ciba Specialty Chemicals K.K), was applied on one side of the aforementioned base and dried to form an adhesive layer of 20 μm thick. Thus, an adhesive sheet was obtained. The elasticity of the adhesive layer at 23 deg. C. was 2.1×10$^5$ Pa. The stress relaxation ratio of the adhesive sheet was 88%.

(Wafer Grinding)

This adhesive sheet was adhered to the mirror surface of a silicone wafer (having a diameter of 200 mm and a thickness of 750 μm) via an adhesive layer using a tape laminator (Adwill RAD3500/m12, manufactured by Lintec Corporation), and the adhesive sheet was cut along the contour of the silicon wafer.

Subsequently, the contact layer surface of the fixing jig was applied to the exposure surface of the adhesive sheet by a vacuum laminate machine (manufactured by Shibaura Mechatronics Corporation) with their centers coinciding to each other. Thus, the semiconductor wafer protecting structure was completed.

This semiconductor wafer protecting structure was placed on and fixed to the processing table of a wafer grinding machine (product name: DFG-840, manufactured by Disco Corporation), and backgrinding was performed until the wafer thickness was reduced to 150 μm. The suctioning surface of the processing table that is located at the passage hole of the fixing jig was partially clogged by an adhesive tape, so that air of the sectioned space in the fixing jig would not be suctioned by the suctioning when the jig was fixed to the processing table.

After grinding, the semiconductor wafer protecting structure was taken out from the wafer grinder, then the vacuum pump nozzle was connected to the opening of the passage hole of the fixing jig so as to suction air from the sectioned space of the fixing jig and thereby deform the contact layer. As a result, the wafer attached to the adhesive sheet could be easily removed from the fixing jig.

Subsequently, the detached wafer with the adhesive sheet was fixed to the ring frame with its ground surface attached to the dicing tape while the adhesive sheet was being peeled off, by a wafer mounter equipped with an adhesive sheet removing mechanism (Adwill RAD-2500F/8, manufactured by Lintec Corporation), whereby the semiconductor wafer was prepared to be given to the dicing process. During these steps, the silicon wafer could be transferred from one device to another without being impaired.

Example 19

Grinding of the wafer was done using the same materials and the same devices as in example 18 except in that the thickness of the wafer after grinding was set at 50 μm.

After the end of grinding, the semiconductor wafer protecting structure was taken out from the wafer grinding machine, and then was mounted to the wafer mounter equipped with an adhesive sheet peeling mechanism. The wafer attached on the adhesive sheet and supported by the fixing jig was fixed to the ring frame with its ground surface attached to the dicing tape. In this condition, the vacuum pump nozzle was connected to the opening of the passage hole of the fixing jig so as to suction air from the sectioned space of the fixing jig and thereby deform the contact layer and detach the fixing jig. Subsequently, the adhesive sheet was peeled off by the removing mechanism of the wafer mounter equipped with a removing mechanism, so that the silicon wafer was prepared to be given to the dicing stage.

In this step, the wafer could be handled without causing flexion even though it was extremely thinned. As a result, the silicon wafer could be transferred from one device to another without being impaired.

Example 20

A non-solvent type urethane acrylate (product name: PM-654F, manufactured by Dainichiseika Color & Chemicals MFg. Co., Ltd.) was cast on one side of the base obtained in the same manner as in Example 18 by a fountain die process, to form an middle layer of 110 μm thick. The elasticity of the middle layer at 23 deg. C. was $1.27 \times 10^5$ Pa. An adhesive layer of 20 μm thick was formed over this middle layer in the same manner as in Example 18 to thereby complete an adhesive sheet. The stress relaxation ratio of the adhesive sheet was 88%.

Thereafter, in the same manner as in Example 18, a semiconductor wafer protecting structure was fabricated. Grinding of the wafer was done in the same manner as in Example 18 using this semiconductor wafer protecting structure, and a silicon wafer of 150 μm thick was obtained. During these steps, the silicon wafer could be transferred from one device to another without being impaired.

Example 21

A semiconductor wafer protecting structure was fabricated in the same manner as in Example 18, except in that a polyethylene film (having a thickness of 110 μm thick, an arithmetic mean roughness Ra of 0.120 μm and a surface energy of 31 mN/m with the maximum tan δ value of 0.13) formed of a low density polyethylene resin (product name: Sumikasen L705, manufactured by SUMITOMO CHEMICAL) was used as the base. Here, the stress relaxation ratio of the adhesive sheet was 30%.

Grinding of the wafer was done in the same manner as in Example 18 using this semiconductor wafer protecting structure, and a silicon wafer of 150 μm thick was obtained. During these steps, the silicon wafer could be transferred from one device to another without being impaired.

Example 22

Grinding of the wafer was done using the same materials and the same devices as in Example 20 except that ink dots (of 100 μm high and having diameters of 100 to 200 μm) were formed (with a pitch of 1 mm) on the mirror surface of a silicon wafer having a diameter of 200 mm and a thickness of 750 μm instead of the silicon wafer of Example 20, to form a simulated high bump silicon wafer, and a silicon wafer of 150 μm thick was obtained. During these steps, the silicon wafer could be transferred from one device to another without being impaired. No dimple due to high bumps was observed on the ground surface of the wafer.

Next, the semiconductor chip fabrication method according to the present invention will be described taking an example. However, the present invention should not be limited at all to this example. Evaluation was done based on the following method.

Example 23

(Fixing Jig Preparation)
A fixing jig was fabricated in the same as in Example 18.
(Wafer Dicing Before Grinding Process)
Half-cut dicing was performed for the mirror surface side of a silicon wafer (having a diameter of 200 mm and a thickness of 750 μm) by a dicing machine (DFD-6561, manufactured by Disco Corporation) so that the wafer was divided by grooves of 120 μm deep into chips of 10 mm×10 mm. Subsequently, the contact layer surface of the fixing jig was attached to the wafer's mirror surface by a vacuum laminate machine (manufactured by Shibaura Mechatronics Corporation) with their centers coinciding to each other, so that the wafer was fixed to the fixing jig.

This was supported and fixed by suction to the processing table of a wafer grinding machine (product name: DFG-840, manufactured by Disco Corporation) having no transfer mechanism for dicing before grinding process, and backgrinding was performed until the wafer thickness was reduced to 100 μm so that the wafer were divided into pieces. Here, the suctioning surface of the processing table that is located at the passage hole of the fixing jig was partially clogged by an adhesive tape, so that air of the sectioned space in the fixing jig would not be suctioned by the suctioning when the jig was fixed to the processing table.

Next, a transfer tape (a UV curable type dicing tape manufactured by Lintec Corporation, product name: Adwill D-650) was attached to the ground surface (chip surface) of the wafer by a wafer mounter equipped with an adhesive sheet removing mechanism (Adwill RAD-2500F/8MUL, manufactured by Lintec Corporation) so that the wafer was fixed to the ring frame. Subsequently, the vacuum pump nozzle was connected to the opening of the passage hole of the fixing jig so as to suction air from the sectioned space of the fixing jig to thereby deform the contact layer. As a result, the contact layer of the fixing jig was easily removed from the group of chips, so that the group of chips was transferred from the fixing jig to the transfer tape.

Use of the fixing jig as above made it possible to perform a dicing before grinding process without causing breakage of chips and disturbing the arrangement of chips. Additionally, the dicing before grinding process could be achieved by a wafer grinding machine without any special delivering device. Further, during these steps, the silicon wafer (group of chips) could be transferred from one device to another without being impaired.

Example 24

Instead of the silicon wafer of Example 23, a silicon wafer having a diameter of 200 mm and a thickness of 750 μm, with simulated high bumps formed of ink dots (of 100 μm high and having diameters of 100 to 200 μm arranged with a pitch of 1 mm) on its mirror surface was used. Also, as an adhesive sheet having a middle layer, a UV curable type protecting adhesive sheet (product name: Adwill E8310LS342F, having a middle layer of 110 μm thick with an adhesive layer of 40 μm thick) was used. Devices, materials and the like that are not particularly mentioned were the same as those used in Example 1.

Half-cut dicing was performed on the bump side of the wafer with bumps by a dicing machine so that the wafer was divided by grooves of 120 μm deep into chips of 10 mm×10 mm. Subsequently, an adhesive sheet is pasted on the bump side by a tape laminator (Adwill RAD3500/m12, manufactured by Lintec Corporation), and the adhesive sheet was cut along the contour of the silicone wafer. Then, the wafer was fixed to the fixing jig by attaching the contact layer side of the fixing jig to the base side of the adhesive sheet by a vacuum laminate machine with their centers coinciding to each other.

This was supported and fixed by suction to the processing table of a wafer grinding machine, and backgrinding was performed until the wafer thickness was reduced to 100 μm so that the wafer were divided into pieces. Here, the suctioning surface of the processing table that is located at the passage hole of the fixing jig was partially clogged by an adhesive tape, so that air of the sectioned space in the fixing jig would not be suctioned by the suctioning when the jig was fixed to the processing table.

Next, a transfer tape was attached to the ground surface (chip surface) of the wafer by a wafer mounter so that the wafer was fixed to the ring frame. Subsequently, the vacuum pump nozzle was connected to the opening of the passage hole of the fixing jig so as to suction air from the sectioned space of the fixing jig and thereby deform the contact layer. As a result, the contact layer of the fixing jig was easily removed from the group of chips, so that the group of chips attached to the adhesive sheet was transferred from the fixing jig to the transfer tape. Further, the adhesive sheet was peeled off by the removing mechanism of the wafer mounter to thereby create a state that only the group of chips was attached to the transfer tape.

Use of the fixing jig as above made it possible to perform a dicing before grinding process without causing breakage of chips and disturbing the arrangement of chips. Additionally, the dicing before grinding process could be achieved by wafer grinding equipment without any special delivering device. Further, during these steps, the silicon wafer (group of chips) could be transferred from one device to another without being impaired.

The invention claimed is:

1. A holding jig for holding a semiconductor wafer, comprising:
    a depressed portion formed on a rigid base plate;
    a plurality of supporting projections arrayed in the depressed portion;
    a deformable contact film layer, covering the depressed portion, being supported by the plurality of supporting projections, for detachably holding a semiconductor wafer in close contact therewith; and,
    an exhaust path for conducting air from the depressed portion covered by the deformable contact film layer to an outside.

2. The holding jig according to claim 1, further comprising a negative pressure source for producing a negative pressure in the depressed portion to deform the deformable contact film layer.

3. The holding jig according to claim 1, wherein the deformable contact film layer contains an antistatic agent.

4. The holding jig according to claim 1, wherein an array pitch between the plural supporting projections is specified to be 0.2 to 2.0 mm.

5. The holding jig according to claim 1, wherein a width of the supporting projection is specified to be 0.05 to 1.0 mm.

6. The holding jig according to claim 1, wherein a height of the supporting projection is specified to be 0.05 to 0.5 mm.

7. The holding jig according to claim 1, wherein a thickness of the deformable contact film layer is specified to be 20 to 200 μm.

8. The holding jig according to claim 1, wherein a tensile strength at break of the deformable contact film layer is specified to be equal to or greater than 5 MPa.

9. The holding jig according to claim 1, wherein an elongation at break of the deformable contact film layer is specified to be equal to or greater than 500%.

10. The holding jig according to claim 1, wherein a bending elasticity at normal temperature of the deformable contact film layer is specified to be 10 to 100 MPa.

11. The holding jig according to claim 1, being used for a semiconductor wafer grinding process.

12. A semiconductor wafer protecting structure comprising a semiconductor wafer, an adhesive sheet laminated on a circuit surface of the semiconductor wafer and a holding jig, laid over each other in this order, wherein;
    the holding jig comprises: a jig base having a plurality of projections on a first side thereof and a side wall having approximately the same height as the projections, formed along a periphery on the first side; and a contact layer, laminated over the first side of the jig base having the projections, and bonded to a surface of the side wall,
    a sectioned space is formed on the first side of the jig base on which projections are formed, by the contact layer, the projections and the side wall,
    at least one passage hole that is penetrated to connect the sectioned space to an outside is formed in the jig base, and
    the contact layer is laid over a surface of the adhesive sheet laminated on the circuit surface of the semiconductor wafer.

13. The semiconductor wafer protecting structure according to claim 12, wherein the adhesive sheet is comprised of a base one side of which has a surface energy of 20 to 60 mN/m and a surface roughness (arithmetic mean roughness Ra) of 1.0 μm or lower and an adhesive layer provided on the opposite surface, and the adhesive layer abuts the circuit surface.

14. The semiconductor wafer protecting structure according to claim 12, wherein the adhesive sheet is comprised of a base, a middle layer formed on the base and an adhesive layer formed on the middle layer, and
    an elasticity of the adhesive layer at 23 deg. C. ranges from $5 \times 10^4$ to $1.0 \times 10^7$ Pa, and the elasticity of the middle layer at 23 deg. C. is equal to or lower than the elasticity of the adhesive layer at 23 deg. C.

15. The semiconductor wafer protecting structure according to claim 12, wherein the adhesive sheet is formed of a base of which the maximum value of tan δ of dynamic viscoelasticity in the temperature range of −5 to 80 deg. C. is 0.5 or greater, and an adhesive layer.

* * * * *